United States Patent
Ueda

(10) Patent No.: US 7,084,035 B2
(45) Date of Patent: Aug. 1, 2006

(54) SEMICONDUCTOR DEVICE PLACING HIGH, MEDIUM, AND LOW VOLTAGE TRANSISTORS ON THE SAME SUBSTRATE

(75) Inventor: Naohiro Ueda, Kobe (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 11/104,433

(22) Filed: Apr. 13, 2005

(65) Prior Publication Data

US 2005/0250342 A1    Nov. 10, 2005

(30) Foreign Application Priority Data

Apr. 13, 2004  (JP) .............................. 2004-117701

(51) Int. Cl.
*H01L 21/8234*   (2006.01)

(52) U.S. Cl. ...................... 438/275; 438/787; 438/981

(58) Field of Classification Search ................ 438/275, 438/987, 787, 490
See application file for complete search history.

(56) References Cited

U.S. PATENT DOCUMENTS

| | | | | |
|---|---|---|---|---|
| 5,861,347 | A * | 1/1999 | Maiti et al. ................. | 438/787 |
| 6,258,673 | B1 * | 7/2001 | Houlihan et al. ........... | 438/275 |
| 6,551,884 | B1 * | 4/2003 | Masuoka .................... | 438/275 |
| 6,645,817 | B1 * | 11/2003 | Druijf et al. ................ | 438/275 |
| 6,780,717 | B1 * | 8/2004 | Yasuoka et al. ............ | 438/276 |
| 6,803,278 | B1 * | 10/2004 | Tran ........................... | 438/258 |
| 6,953,727 | B1 * | 10/2005 | Hori ........................... | 438/275 |
| 2001/0016388 | A1 * | 8/2001 | Koyama et al. ............ | 438/275 |

FOREIGN PATENT DOCUMENTS

| | | |
|---|---|---|
| JP | 59-194472 | 11/1984 |
| JP | 5-136353 | 6/1993 |
| JP | 2001-15612 | 1/2001 |

* cited by examiner

*Primary Examiner*—Michelle Estrada
(74) *Attorney, Agent, or Firm*—Dickstein Shapiro Morin & Oshinsky LLP

(57) ABSTRACT

A method for forming three kinds of MOS transistors on a single semiconductor substrate, each provided with gate oxides different in thickness from each other, without detracting from the device characteristics. The method includes the steps of forming a dielectric layer for device isolation for defining first, second, and third regions, and buffer oxide layers on the surface of a semiconductor substrate; after forming an oxidation resistance layer, which has an opening for exposing the first region, performing a first thermal oxidation process for forming a first gate oxide layer overlaying the first region; forming a first gate electrode on the first gate oxide layer; removing the buffer oxide layer overlying the third region, having an opening for exposing the third region; performing a second thermal oxidation process for forming a second gate oxide layer, having a thickness different from the first gate oxide, and for forming a third gate oxide layer having a thickness different from the first, and the second gate oxides.

6 Claims, 13 Drawing Sheets

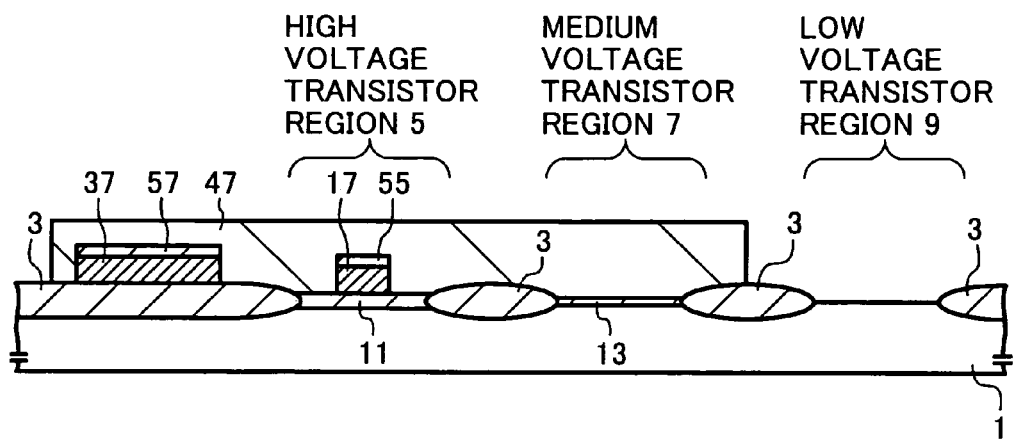
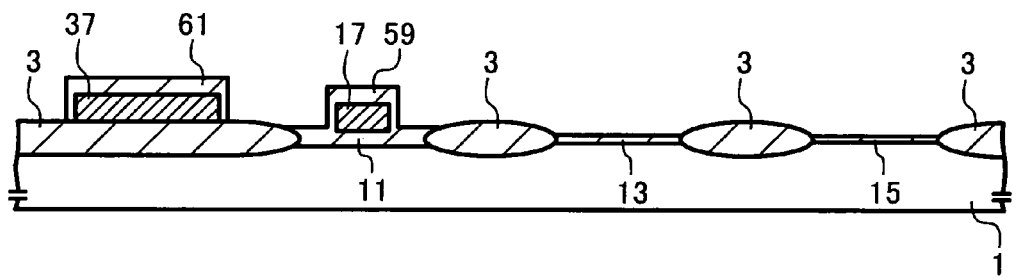
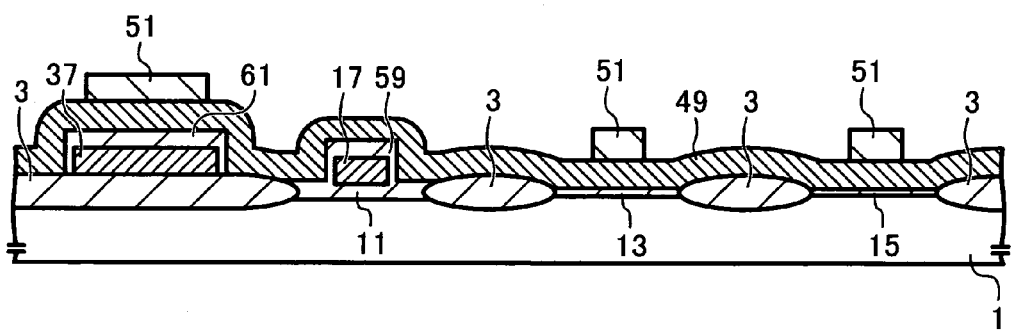
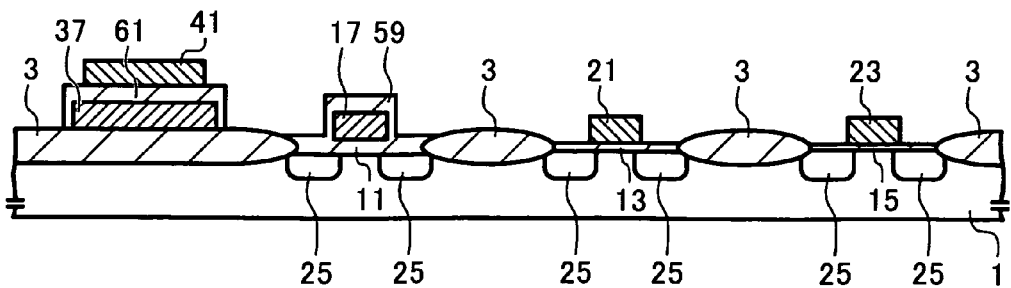

SEMICONDUCTOR DEVICE PLACING HIGH, MEDIUM, AND LOW VOLTAGE TRANSISTORS ON THE SAME SUBSTRATE

This application claims priority to Japanese Patent Application No. 2004-117701, filed with the Japanese Patent Office on Apr. 13, 2004, the entire contents of which are hereby incorporated by reference.

FIELD OF THE INVENTION

This invention relates generally to methods for forming semiconductor devices, and more specifically to a method for forming three kinds of MOS transistors on a single semiconductor substrate, each transistor being provided with gate oxides of differing thicknesses, and a semiconductor device including such transistors.

BACKGROUND OF THE INVENTION

As the density of integrated circuits increase and the requirements for integrated circuits broaden, transistors included in the circuits are designed to operate under different operating conditions and the structure of the transistors must be suitably fabricated.

By way of example, when 5-volt signals are input from the exterior to a circuit which internally performs signal processing at 3 volts, the thickness of the gate oxide layer of a transistor receiving the 5-volt signals has to be larger to meet reliability requirements. That is, a circuit is needed that has input/output transistors which operate at 5 V so that the circuit may be used in systems operating at 5 V while allowing other portions of the device to operate at 3 V.

Another problem occurs when a component, which operates at a higher voltage, such as a flash memory device, is also onboard, a voltage of 15 V or higher is required to perform writing and erasing steps, and a MOS transistor carrying out these steps must have a gate oxide layer with a thickness larger than conventional MOS transistors in order to obviate a possible dielectric breakdown.

One method that has been used to overcome this problem uses two kinds of transistors formed on a single semiconductor substrate, each provided with gate oxide layers of differing thicknesses. In order to form these transistors on the same semiconductor substrate, it is requisite to dispose gate oxide layers each selectively having an arbitrary and different thickness.

There are several known methods for forming gate oxide layers of different thicknesses, such as, for example, Japanese Laid-Open Patent Applications No. 59-194472 ('472 application) and 5-136353 ('353 application).

FIGS. 4A through 4D illustrate cross-sectional views of a semiconductor device during various fabrication steps according to the '472 application, which discloses a method for forming two transistors on a single semiconductor substrate, each provided with gate oxide layers of differing thicknesses.

In reference to FIGS. 4A through 4D, the steps for forming the abovementioned semiconductor device are now described.

LOCOS (local oxidation of silicon) layer 53 is deposited on the surface of a semiconductor substrate 51 for defining a first region 63 where a low voltage MOS transistor is to be formed, which is provided with a gate oxide layer, having a relatively small thickness (i.e., low voltage transistor region); and a second region 65 where a high voltage MOS transistor is to be formed, which is provided with a gate oxide layer, having a relatively large thickness (i.e., high voltage transistor region).

In addition, a buffer oxide layer 67 is subsequently formed to cover the transistor regions 63, 65 on the semiconductor substrate 51, having a thickness of approximately 11 nm (FIG. 4A).

A resist (photoresist) pattern 69 is formed to have an opening for exposing the low voltage transistor region 63, and to mask the high voltage transistor region 65.

The portion of the buffer oxide layer 67 overlying the low voltage transistor region 63 is removed using the resist pattern 69 as a mask (FIG. 4B).

After removing the resist pattern 69, the structure is subjected to a thermal oxidation process at 850° C. so that a gate oxide layer 71 is formed overlying the low transistor region 63, having a thickness of 11 nm (FIG. 4C).

Through an additional oxidation process, the portion of the buffer oxide layer 67 overlying the high voltage transistor region 65 increases in thickness so that another gate oxide layer 73 is formed, having a thickness of 16 nm (FIG. 4C).

A second polysilicon layer, used for forming gate electrodes, is deposited on the surface of the semiconductor, which is subsequently subjected to patterning steps so that gate electrodes 75, 75 are formed on the gate oxide layers 71, 73, respectively.

Thereafter, impurity diffusion layers 77 are formed, to subsequently provide sources and drains, in the semiconductor substrate 51.

Through these fabrication steps, a low voltage transistor overlying the low voltage transistor region 63 with the gate oxide layer, having a thickness of 11 nm; and a high voltage transistor overlying the high voltage transistor region 65 with the gate oxide layer, having a thickness of 16 nm (FIG. 4D) are formed.

Including these steps, the above-mentioned method offers a relatively simple way for forming two transistors of differing thicknesses, however, several difficulties arise.

One such difficulty, for example, in the high voltage transistor region 65 shown in FIG. 4B, is that the buffer oxide layer 67 is in direct contact with the resist pattern 69 during processing. Since photoresist materials may contain various impurities, which are undesirable in semiconductor device fabrication, such as heavy metal ions and organic materials, it is possible for the buffer oxide layer 67 to be contaminated by the impurities.

In addition, since the buffer oxide layer 67 is subsequently formed as gate oxide layer 73 through the additional thermal oxidation process, these contaminants may remain in the layer. This may result in the malfunction or decrease in reliability of the semiconductor device.

An additional difficulty in the known method is presented during the etching step, shown in FIG. 4B, for removing the buffer oxide layer 67 in the low voltage transistor region 63. During the etching step, not only the buffer oxide layer 67 but also portions of the LOCOS layer 53, adjacent to the low voltage transistor region 63, are removed. As a result, the thickness of the LOCOS layer 53 decreases so that dips 79 are caused in the vicinity of a LOCOS layer for device isolation on a semiconductor substrate, as shown in FIG. 5. This gives rise to adverse effects, such as discrepancies in device characteristics from the design values, or an undesirable concentration of electric field caused by the decrease in the LOCOS layer thickness, which results in deterioration in the ability to withstand voltage.

In order to obviate the aforementioned first difficulty related to the buffer oxide layer in direct contact with the resist pattern, several remedies have been proposed, such as, for example, the formation of a barrier layer between an oxide layer and a resist layer (Japanese Laid-Open Patent Application No. 2001-15612). Alternatively, another remedy adds a cleaning process step for removing contaminants or impurities from the surface of silicon oxide layer.

However, the additional step(s) of forming the barrier layer and/or cleaning the impurities may give rise to further difficulties by complicating the process flow of the device fabrication.

In addition, when the number of repeated resist coatings increase, even after the cleaning steps are added accordingly, another adverse effect occurs. The quality of the oxide layer will deteriorate due to from the impurities of the resist material.

The results obtained by the present inventor, as shown in FIG. 6, indicate that the quality of oxide layer degrades with the increase in the number of times a resist coating is applied, even when cleaning steps are added.

FIG. 6 illustrates a plot of the Weibull distribution with F cumulative defective fraction, versus charge-to-breakdown (coulombs) for device samples subjected to one, three, and five resist coatings.

In order to obviate the aforementioned first difficulty related to dip formation, conventionally the amount of the layer removed is suitably reduced so that the formation of the dip portions 79 is suppressed.

In this context, the suitable amount of etching is examined next. In order to thoroughly remove the buffer oxide layer 67, it is inevitable to provide over-etching to a certain degree. The condition for a suitable amount of etching may therefore be expressed by:

$$\text{(practical etching amount)} = \text{(thickness of oxide layer 67)} \times 1.3 \quad (1).$$

Specific values related to the expression are shown in Table 1.

TABLE 1

| Thickness of oxide layer | Practical etching amount | Amount over-etched |
|---|---|---|
| 11 nm | 14.3 nm | 3.3 nm |
| 15 nm | 19.5 nm | 4.5 nm |
| 20 nm | 26.0 nm | 6.0 nm |
| 40 nm | 52.0 nm | 12.0 nm |

It is shown in Table 1 that the larger the thickness of the oxide layer, the larger the amount that is over-etched. On the other hand, approximate figures of the layer thickness are obtained from the relation $$\text{(thickness of oxide layer 73)}^2 = \text{(thickness of oxide layer 76)}^2 + \text{(thickness of oxide layer 71)}^2 \quad (2).$$

Relation (2) indicates that the thickness of at least one of buffer oxide layer 67 or the gate oxide layer 71 has to increase in order for the thickness of the gate oxide layer 73 to increase. That is, in order to increase the thickness of the gate oxide layer 73, several points have to be considered: (1) the thickness of buffer oxide layer 67 has to increase, (2) this gives rise to concomitant increase in etching amount to remove the buffer oxide layer 67, and (3) increase in the degree of deformation around the dip portion 79.

In addition, since the gate oxide layer 73 serves as the gate oxide layer for the high voltage transistor, the operating voltage of this transistor can be higher by increasing the thickness of the gate oxide layer 73. Therefore, it is a trade-off between the dip deformation and the operating voltage of the high voltage transistor.

In reference to FIGS. 7A through 7D, the steps disclosed in the aforementioned '353 application are now described.

FIGS. 7A through 7D illustrate cross-sectional views of a semiconductor device during various fabrication steps for forming two transistors on a single semiconductor substrate, each provided with gate oxide layers of differing thicknesses.

After forming a LOCOS layer 53 on the surface of a semiconductor substrate 51 to define a low voltage transistor region 63 and a high voltage transistor region 65, gate oxide layers 81, 81 are formed, which covers the transistor regions 63, 65 on the semiconductor substrate 51, having a thickness of approximately 16 nm. Thereafter, a polysilicon layer 83 is formed on the entire surface of the structure (FIG. 7A).

A resist pattern 69 is formed to mask the high voltage transistor region 65 and to have an opening for exposing the low voltage transistor region 63.

Using the resist pattern 69 as a mask, the portions of the polysilicon layer 83 and the gate oxide layer 81 overlying the low voltage transistor region 63 are successively removed by etching (FIG. 7B).

After removing the resist pattern 69, the structure is subjected to a thermal oxidation process at 850° C. so that a gate oxide layer 71 is formed overlying the low transistor region 63, having a thickness of 11 nm. Since the gate oxide layer 81 overlying the high voltage transistor region 65 is masked by a polysilicon layer 83, no change in thickness occurs in the oxide layer 81 during the oxidation process. The previous 16 nm thickness is maintained.

In addition, a polysilicon layer 85 is formed on the surface of the structure. Thereafter, the portion of the polysilicon layer 85 overlying the high voltage transistor region 65 is removed (FIG. 7C).

By patterning the polysilicon layers 83, 85, a first gate electrode 83a is formed of the polysilicon layer 83 on the gate oxide layer 81, and a second gate electrode 85a is formed of the polysilicon layer 85 on the gate oxide layer 71.

Subsequently, impurity diffusion layers 77 are formed to provide sources and drains in the semiconductor substrate 51.

Through these fabrication steps, a low voltage transistor in the low voltage transistor region 63 with the gate oxide layer, having a thickness of 11 nm; and a high voltage transistor in the high voltage transistor region 65 with the gate oxide layer, having a thickness of 16 nm (FIG. 7D) are formed.

This method offers the advantage that the polysilicon layer 83 is formed after forming the gate oxide layer 81 without disposing a resist layer on the gate oxide layer 81. As a result, contamination of the gate oxide layer 81 by the impurities, such as heavy metal ions and organic materials contained in photoresist materials, is prevented.

However, several additional steps must be added, such as: (a) after removing only the portion of polysilicon layer 83, overlying the low voltage transistor region 63 (as in the above section (2)), further disposing another polysilicon layer 85 (as in the above section (3)); and (b) removing the portion of the polysilicon layer 85 overlying the high voltage transistor region 65 (as in the above section (3)). This complicates the process flow for the device fabrication.

While the advantages and drawbacks have been described herein above on the methods disclosed in the '472 and '353 applications, these applications are primarily concerned with the thickness of of the two oxide layers.

The recent trend toward higher capabilities and sophistication of digital information apparatuses, while reducing device costs, leads to the need and desire for a single semiconductor substrate having three MOS transistors, provided with gate oxides of differing thicknesses.

The technique of forming three MOS transistors on a single semiconductor substrate is in general called as "triple-gate oxide layer" or "triple gate" technique. However, the simple, reliable method for realizing the triple gate formation is yet to be established and no disclosure thereof has been found so far.

Therefore, described herein is the expected process flow when the fabrication steps, which have been described according to the '472 and '353 applications, are applied, in a straightforward manner, for the formation of three transistors with gate oxides different in thickness from each other.

First, the process steps described below, by the method disclosed in the '472 application, is applied to the formation of three transistors with gate oxides different in thickness from each other.

FIGS. 8A through 8F are cross-sectional views of a semiconductor device during various fabrication steps.

LOCOS layer 53 for device isolation is deposited on the surface of a semiconductor substrate 51 to be in use for defining a first region 63 where a low voltage MOS transistor is to be formed, which is provided with a gate oxide layer, having a relatively small thickness or smallest among three transistors (i.e., low voltage transistor region 63); a second region 64 where a medium voltage MOS transistor is to be formed, which is provided with another gate oxide layer, having a medium thickness (i.e., medium voltage transistor region 64); and a third region 65 where a high voltage MOS transistor is to be formed, which is provided with still another gate oxide layer, having a large thickness (i.e., high voltage transistor region 65).

In addition, a buffer oxide layer 67 is subsequently formed, overlying the low, medium, and high transistor regions 63, 64, 65, having a thickness of approximately 11 nm (FIG. 8A).

A medium voltage transistor is understood to mean a transistor that properly operates at an applied voltage between the voltages suitably applied to the low and high voltage transistors.

A resist pattern 87 is formed to mask the high voltage transistor region 65, and to have an opening for exposing the low and medium voltage transistor regions 63, 64.

The portions of the buffer oxide layer 87 overlying the low and medium voltage transistor regions 63, 64 are all removed using the resist pattern 87 as a mask (FIG. 8B).

After removing the resist pattern 87, the structure is subjected to a thermal oxidation process at 850° C. so that a gate oxide layer 71 is formed overlying the low and medium transistor regions 63, 64, having a thickness of 11 nm (FIG. 8C).

Through an additional oxidation process, the portion of the buffer oxide layer 67 overlying the high voltage transistor region 65 increases in thickness so that another gate oxide layer 73 is formed, having a thickness of 16 nm.

Another resist pattern 89 is formed to mask the medium and high voltage transistor regions 64 and 65, and to have an opening for exposing the low voltage transistor region 63 (FIG. 8D).

Using the resist pattern 89 as a mask, the portion of the gate oxide layer 71 overlying the low voltage transistor region 63 is thoroughly removed.

After removing the resist pattern 89, the structure is subjected to a thermal oxidation process at 850° C. so that a gate oxide layer 91 is formed overlying the low transistor region 63, having a thickness of 11 nm (FIG. 8E).

Through an additional oxidation process, the portion of the gate oxide layer 71 overlying the medium voltage transistor region 64 increases in thickness so that another gate oxide layer 95 is formed, having a thickness of 20 nm.

A polysilicon layer is deposited on the entire surface. By patterning the polysilicon layer, gate electrodes 75 are formed on the gate oxide layers 91, 93, 95, respectively. Thereafter, impurity diffusion layers 77, for providing sources and drains, are formed in the semiconductor substrate 51.

Through these fabrication steps, a low voltage transistor in the low voltage transistor region 63 with the gate oxide layer having a thickness of 11 nm, a medium voltage transistor in the medium voltage transistor region 64 with the gate oxide layer having a thickness of 16 nm, and a high voltage transistor in the high voltage transistor region 65 with the gate oxide layer having a thickness of 20 nm (FIG. 8F) are formed.

Since the above-mentioned process steps are adopted in a straightforward manner, from those of FIGS. 4A through 4D, it is needless to repeat the aforementioned difficulties of 'direct contact' and 'dip formation'.

In addition, with regard to the 'direct contact' difficulty, reliability of the gate oxide layer 95 is more likely to decrease as the number of resist steps used increases.

With regard to the aforementioned 'dip formation' difficulty, since the number of repeated etching removal steps increased, the deformation of the dip, is enhanced, as shown in FIG. 9. As a result, the discrepancy in the device characteristics from the design values further increases. Therefore, deterioration in the ability to withstand voltage increases.

Secondly, the process steps described below, from the method disclosed in the '353 application, is applied to the formation of three transistors with gate oxides different in thickness from each other.

FIGS. 10A through 10E illustrate cross-sectional views of a semiconductor device during various fabrication steps.

After forming LOCOS layer 53, on the surface of a semiconductor substrate 1, for defining the low voltage transistor region 63, medium voltage transistor region 64, and high voltage transistor region 65, gate oxide layers 97 are formed overlying the low, medium, and transistor regions 63, 64, 65, having a thickness of 20 nm. Thereafter, a polysilicon layer 81 is deposited on the entire surface over the semiconductor substrate 51 (FIG. 10A).

A resist pattern 99 is formed to mask the high voltage transistor region 65 and to have openings for exposing the low voltage transistor region 63 and medium voltage transistor region 64 (FIG. 10B).

Using the resist pattern 49 as a mask, the portions of the polysilicon layer 81 and gate oxide layer 97 overlying the low voltage transistor region 63 and the medium voltage transistor region 64 are successively removed by etching.

After removing the resist pattern 99, the structure is subjected to a thermal oxidation process under oxidizing atmosphere at 850° C. so that gate oxide layers 73 are formed overlying the low transistor region 63 the medium voltage transistor region 64, each having a thickness of 16 nm. Since the gate oxide layer 97 overlying the high voltage transistor region 65 is masked by polysilicon layer 81, no change in thickness takes place for the oxide layer 97 during the oxidation process and the previous 16 nm thickness is maintained.

Thereafter, another polysilicon layer 101 is deposited on the entire surface over the semiconductor substrate 51, and a further resist pattern 103 is formed to mask the medium voltage transistor region 64 and to have openings for exposing the low voltage transistor region 63 and high voltage transistor region 65. Using the resist pattern 103 as a mask, the portions of the polysilicon layer 101 and gate oxide layer 73 overlying the low voltage transistor region 63 and the high voltage transistor region 65 are successively removed by etching (FIG. 10C).

After removing the resist pattern 103, the structure is subjected to a further thermal oxidation process at 850° C. so that a gate oxide layer 71 is formed overlying the low transistor region 63, having a thickness of 11 nm. Since the gate oxide layer 97, overlying the high voltage transistor region 65, is masked by polysilicon layer 81, no change in the thickness occurs for the oxide layer 97 and the previous 16 nm thickness is maintained.

Subsequently, another polysilicon layer 105 is deposited on the entire surface over the semiconductor substrate 51, and a resist pattern 107 is formed to mask the low voltage transistor region 63 and to openings for exposing the medium voltage transistor region 64 and high voltage transistor region 65. Using the resist pattern 107 as a mask, the portions of the polysilicon layer 101 overlying the medium voltage transistor region 64 and the high voltage transistor region 65 is removed by etching (FIG. 10D).

By patterning the polysilicon layers 81, 101, 105, a first gate electrode 81a is formed of the polysilicon layer 81 on the gate oxide layer 97, a second gate electrode 101a, of the polysilicon layer 101 on the gate oxide layer 73, and a third gate electrode 105a of the polysilicon layer 105 on the gate oxide layer 71.

Subsequently, impurity diffusion layers 77 are formed, to provide sources and drains, in the semiconductor substrate 51.

Through these fabrication steps, a low voltage transistor in the low voltage transistor region 63 with the gate oxide layer, having a thickness of 11 nm; a medium voltage transistor in the medium voltage transistor region 64 with the gate oxide layer, having a thickness of 16 nm; and and a high voltage transistor in the high voltage transistor region 65 with the gate oxide layer, having a thickness of 20 nm (FIG. 10E) are formed.

Since the above-mentioned process steps are adopted in a straightforward manner from those of FIGS. 7A through 7D, it is unnecessary to describe the increase in the number of process steps, which are required for forming and removing the portions of polysilicon layers 81, 101, 105 overlying specific transistor regions. These steps complicate the process flow of the device fabrication, and thereby result in a cost increase.

As indicated herein above, it has been difficult to fabricate three different kinds of MOS transistors on a single semiconductor substrate, each provided with gate oxides of differing thicknesses.

It is desirable, therefore, to provide, without detracting from the MOS device characteristics, a method for placing three kinds of MOS transistors on a single semiconductor substrate, each provided with gate oxides of differing thicknesses.

SUMMARY

Accordingly, it is an object of the present invention to provide a method for forming three kinds of MOS transistors on a single semiconductor substrate, each provided with gate oxides of differing thicknesses, having most, if not all, of the advantages and features of similar methods, while eliminating many of their disadvantages.

The above and other objects of the present invention are achieved by providing a method comprising the following steps: (a) forming a dielectric layer for device isolation on the surface of a semiconductor substrate for defining first, second, and third regions; (b) depositing buffer oxide layers on the surface of the semiconductor substrate each overlying the first, second, and third regions; (c) after forming an oxidation resistance layer to have an opening for exposing the first region and to mask the second, and third regions, performing a first thermal oxidation process for forming a first gate oxide layer by increasing the layer thickness of the oxide layer overlaying the first region; (d) after removing the oxidation resistance layer, depositing a first polysilicon layer over the entire surface of the semiconductor substrate to be pattered for forming a first gate electrode on the first gate oxide layer; (e) forming a resist pattern to have an opening for exposing the third region and to mask the first, and second regions; (f) removing the buffer oxide layer on the third region using the resist pattern as a mask; (g) after removing the resist pattern, performing a second thermal oxidation process for forming a second gate oxide layer by increasing the layer thickness of the buffer oxide layer overlaying the second region, having a thickness different from the first gate oxide, and for forming a third gate oxide layer by increasing the layer thickness of the buffer oxide layer overlaying the third region, having a thickness different from the first, and second gate oxides; and (h) after depositing a second polysilicon layer over the entire surface of the semiconductor substrate, patterning the second polysilicon layer for forming second, and third gate electrodes on the second, and the third gate oxide layers, respectively.

In addition, the method further includes the following steps, such as forming a first capacitor electrode formed of the first polysilicon layer on the dielectric layer for device isolation, performed during step (d); forming a capacitor dielectric layer on the first capacitor electrode simultaneously with the second, and third gate oxide layers, performed during step (g); and forming a second capacitor electrode formed of the second polysilicon layer on the capacitor dielectric layer, performed during step (h).

Through these steps a capacitor component is formed, including the first capacitor electrode, capacitor dielectric layer, and second capacitor electrode on the dielectric layer for device isolation.

In addition, the method may alternatively include the following steps, such as forming a capacitor dielectric layer after forming, and prior to patterning the first polysilicon layer, subsequently forming a first accumulated pattern of the first gate electrode and the capacitor dielectric layer on the gate oxide layer by patterning the capacitor dielectric layer and the first polysilicon layer, and a second accumulated pattern of the first capacitor electrode formed of the first polysilicon layer and the capacitor dielectric layer on the dielectric layer for device isolation, performed during step (d); and forming a second capacitor electrode formed of the second polysilicon layer on the capacitor dielectric layer, performed during step (h).

Through these steps a capacitor component is also formed, including the first capacitor electrode, capacitor dielectric layer, and second capacitor electrode on the dielectric layer for device isolation.

Further, the oxidation resistance layer used essentially consists of silicon nitride.

In another aspect of the invention, a semiconductor device is provided, including the three kinds of MOS transistors, formed on a single semiconductor substrate and each provided with gate oxides of differing thicknesses, which are formed by the abovementioned process steps.

These and other features and advantages thereof will be more clearly seen from the following detailed description of the invention which is provided in connection with the appended claims and accompanying drawings.

BRIEF DESCRIPTION OF THE DRAWINGS

FIGS. 3A through 3H illustrate exemplary cross-sectional views of a semiconductor device during various fabrication steps according to another embodiment disclosed herein;

DETAILED DESCRIPTION OF PREFERRED EMBODIMENTS

Figure 1A:
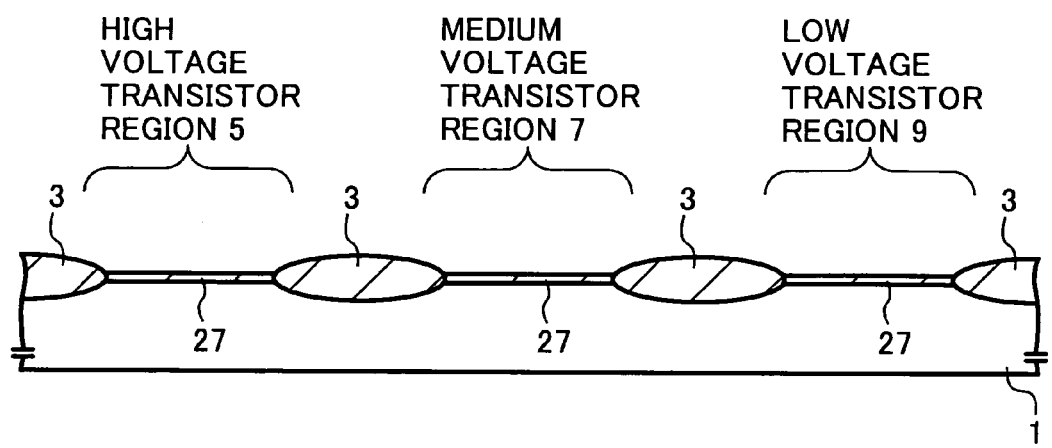
FIGS. 1A through 1G illustrate exemplary cross-sectional views of a semiconductor device during various fabrication steps according to one embodiment disclosed herein.

In the detailed description which follows, specific examples are described regarding a method for forming three kinds of MOS transistors on a single semiconductor substrate, each provided with gate oxides of differing thicknesses.

It is to be understood, however, that the present disclosure is not limited to these embodiments. For example, it is appreciated that the methods described herein may also be adaptable to any form of semiconductor devices. Other embodiments will be apparent to those skilled in the art upon reading the following description.

In the process steps (a) through (h), described earlier in the summary section, a dielectric layer for device isolation is formed on the surface of a semiconductor substrate for defining first, second, and third regions, and buffer oxide layers are deposited each overlying the first, second, and third regions.

Since a first gate oxide layer is formed during a first thermal oxidation process by increasing the layer thickness of the buffer oxide layer overlaying the first region (step c), no resist pattern is brought into contact with the first gate oxide layer.

And, since a third gate oxide layer is formed during a second thermal oxidation process by increasing the layer thickness of the buffer oxide layer overlaying the second region (step f), no resist pattern is brought into contact with the second gate oxide layer.

Further, after using a resist pattern to create an opening for masking the second region, a second gate oxide layer is formed during the second thermal oxidation process by increasing the layer thickness of the buffer oxide layer overlaying the second region. As a result, the second gate oxide layer comes to contact with a resist pattern once (step e).

As a result, contamination from photoresist impurities can be prevented during the formation of the first and third gate oxide layers, while the contamination keep maintained to a minimal level for the second gate oxide layers 13.

In addition, the removal of the buffer oxide layer is carried out only for the third region, and not for the first and second regions. The formation of undesirable dip portions, caused by etching, can be avoided on the dielectric layer for device isolation adjacent to the first and second regions.

As a result, three kinds of MOS transistors, which are each provided with gate oxide layers of differing thicknesses, can be formed, without detracting from any of the transistor characteristics.

In addition, two kinds of polysilicon are used, one for forming the second and third gate electrodes, and the other for the first gate electrode. Therefore, the MOS transistors of three kinds can be formed with relative ease and with a reduced number of fabrication steps.

In the present method, a first capacitor electrode is formed of a first polysilicon layer on the dielectric layer for device isolation, which is performed during step (d); a capacitor dielectric layer is formed on the first capacitor electrode simultaneously with the second and third gate oxide layers, which is performed by second thermal oxidation process during step (g); and a second capacitor electrode is formed of the second polysilicon layer on the capacitor dielectric layer performed during step (h).

As a result, a capacitor component, comprising the first capacitor electrode, capacitor dielectric layer, and second capacitor electrode, can be formed on the dielectric layer for device isolation with relative ease without increasing the number of fabrication steps.

Alternatively, a silicon oxide layer, used in forming the capacitor dielectric layer of the capacitor component, is formed on the first polysilicon layer, a first accumulated pattern of the first gate electrode and silicon oxide layer, and a second accumulated pattern of the first capacitor electrode and silicon oxide layer are formed of the silicon oxide layer and first polysilicon layer, which is performed during step (d), and a capacitor dielectric layer is formed by increasing the thickness of the silicon oxide layer on the first capacitor electrode, which is performed during step (g); and a second capacitor electrode is formed simultaneously with the second and third gate electrodes, which is performed during step (h).

Therefore, another capacitor component can be formed, comprising the first capacitor electrode, capacitor dielectric layer, and second capacitor electrode on the dielectric layer for device isolation with relative ease without increasing the number of fabrication steps.

In addition, by suitably taking the effects of the layer thickness increase into consideration regarding the second thermal oxidation process steps during step (g), the formation of the capacitor dielectric layer becomes feasible, which yields an arbitrary, desirable thickness of the capacitor dielectric layer.

While the capacitor dielectric layer 61 is formed of a silicon oxide layer, a layer of either silicon nitride or ONO may alternatively be used. In the case of silicon nitride, process performance can be improved, because of the etching selectivity of silicon nitride is higher than the etching selectivity of silicon oxide.

Therefore, three kinds of MOS transistors are formed on a single semiconductor substrate, each provided with gate oxides of differing thicknesses, without detracting from the device characteristics.

Having generally described the present invention, the following examples are provided to further illustrate the preferred embodiments of the invention.

Figure 1B:
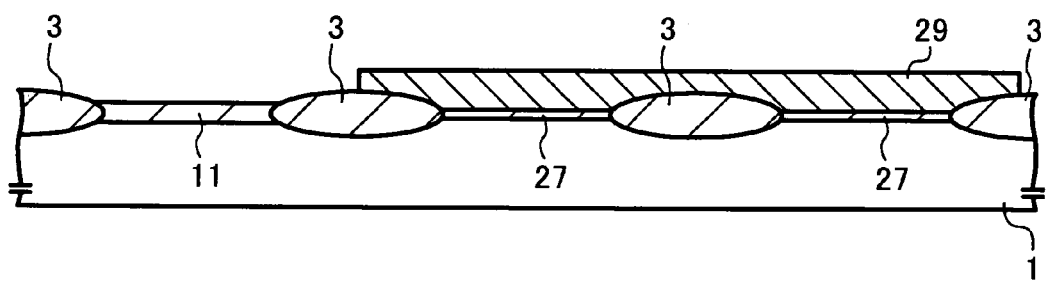
Figure 1C:
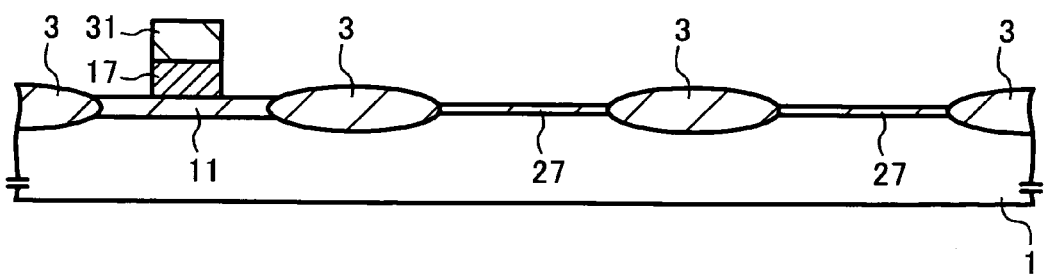
Figure 1D:
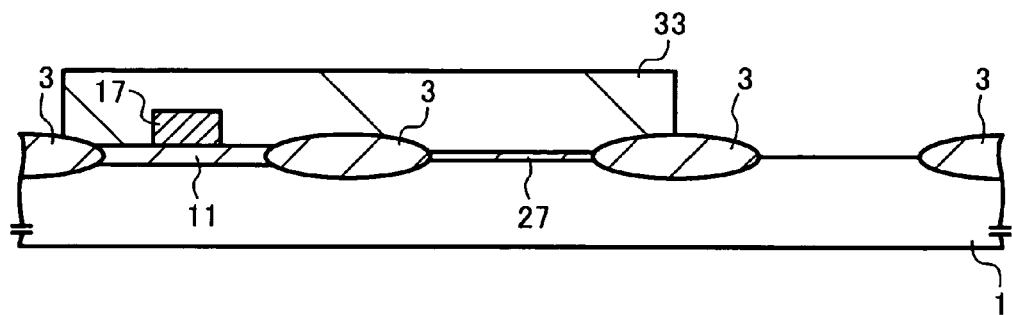
Figure 1E:
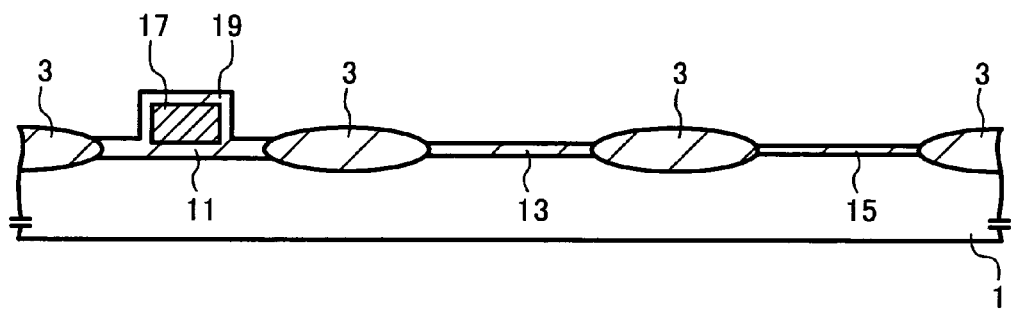
Figure 1F:
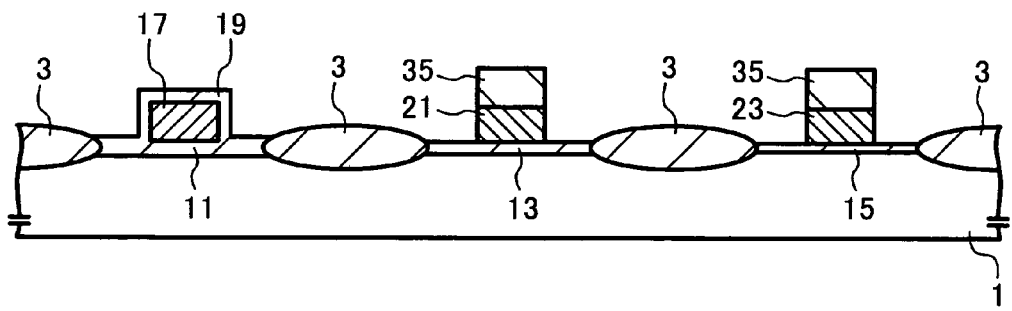
Figure 1G:
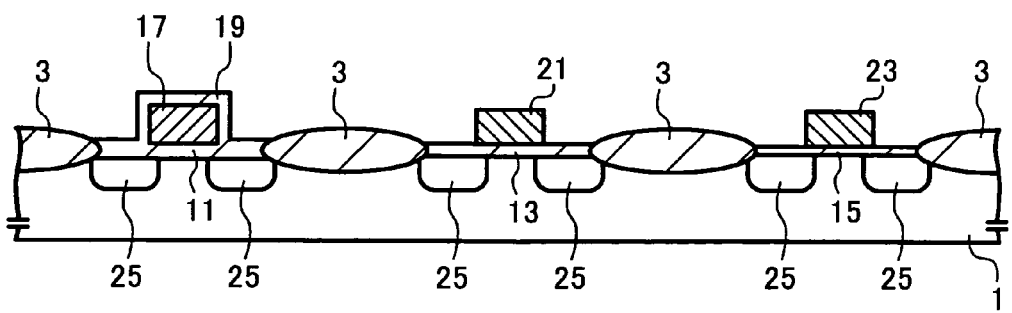

FIGS. 1A–1G illustrate cross-sectional views of a semiconductor device during various fabrication steps according to one embodiment disclosed herein, in which FIG. 1G illustrates a cross section of the the semiconductor device.

Referring now to FIGS. 1A–1G, the structure of the semiconductor device is now described.

The device is shown as a P-type silicon substrate 1, for example. LOCOS layer 3 for device isolation is formed on the surface of the substrate 1.

Field insulating regions 3 formed of a LOCOS layer serve to define a first region 5 where a high voltage MOS transistor is to be formed (high voltage transistor region 5), a second region 7 where a medium voltage MOS transistor is to be formed (medium voltage transistor region 7), and a third region 9 where a low voltage MOS transistor is to be formed (low voltage transistor region 9).

The medium voltage transistor properly operates at an applied voltage between the voltages applied to the low and high voltage transistors 9, 5.

A first gate oxide layer 11 is formed, overlying the high voltage transistor region 5 on the semiconductor substrate 1, having a thickness of approximately 20 nm, for example. A second gate oxide layer 13 is formed, overlying the medium voltage transistor region 7 on the semiconductor substrate 1, having a thickness of approximately 16 nm, and a third gate oxide layer 15 is formed, overlying the low voltage transistor region 9 on the semiconductor substrate 1 and having a thickness of approximately 11 nm, for example.

A first gate electrode 17 of polysilicon is then formed on the first gate oxide layer 11 overlying the high voltage transistor region 5. On the surface of the first gate electrode 17, a silicon oxide layer 19 is formed simultaneously with the third gate oxide layer 15 and the second gate oxide layer 13.

A second gate electrode 21 of polysilicon is formed on the second gate oxide layer 13 overlying the medium voltage transistor region 7. In addition, a third gate electrode 23 of polysilicon is formed on the third gate oxide layer 15 overlying the low voltage transistor region 7. It should be noted that the second and third gate electrodes 21, 23 are formed of the same polysilicon, while the first gate electrode 17 is formed of different polysilicon.

Sources and drains 25, 25 are subsequently formed on both sides of the gate electrodes 17, 21, 23 overlying the transistor regions 5, 7, 9, respectively. These sources and drains 25, 25 are formed as N-type impurity diffused layers, for example.

The high voltage transistor, formed in the high voltage transistor region 5, which is provided with the first gate oxide layer 11, the first gate electrode 17, and the impurity diffused layers 25, 25, serves as a high voltage transistor operative at relatively high voltages, such as, for example, 10 volts and higher.

The medium voltage transistor, formed in the medium voltage transistor region 7, which is provided with the second gate oxide layer 13, the second gate electrode 21, and the impurity diffused layers 25, 25, serves as a medium voltage transistor operative at medium voltages, such as, for example, approximately 5 volts.

In addition, the low voltage transistor, formed in the low voltage transistor region 9, which is provided with the third gate oxide layer 15, the third gate electrode 23, and the impurity diffused layers 25, 25, serves as a low voltage, high speed transistor operative at relatively low voltages, such as, for example, approximately 3 volts.

In reference to FIGS. 1A through 1G, the steps for forming the above-mentioned semiconductor device will be described according to one embodiment of the invention. By means of LOCOS techniques, a LOCOS layer 3 for device isolation is grown on the surface of a semiconductor substrate 1 to define the regions 5, 7, 9 where the high, medium and low voltage transistors are to be formed, respectively. In addition, a buffer oxide layer 27 is subsequently formed, overlying the transistor regions 5, 7, 9 on the semiconductor substrate 1, by subjecting the structure to a thermal oxidation process at 850° C. for 30 minutes, for example, so that the oxide layer 27 has a thickness of approximately 11 nm (FIG. 1A).

An oxidation resistance layer 29 is formed to mask the medium voltage transistor region 7 and the low voltage transistor region 9, and to have an opening for exposing the high voltage transistor region 5.

The oxidation resistance layer 29 is preferably formed as a layer of silicon nitride, having a thickness of 15 nm, for example. By using silicon nitride as the material for forming the oxidation resistance layer 29, process performance is improved due to, a higher etching selectivity of silicon nitride than the etching selectivity of silicon oxide.

The structure is then subjected to a thermal oxidation process at 850° C. for 20 minutes (first thermal oxidation process). Through an additional oxidation process, the portion of the buffer oxide layer 27 overlying the high voltage transistor region 5, which is uncovered by oxidation resistance layer 29, increases in thickness so that a first gate oxide layer 11 is formed, overlying the transistor region 5, having a thickness of 20 nm.

During the oxidation process, the oxidation resistance layer 29 is hardly oxidized because of its relatively low reactivity with oxygen. In addition, since the buffer oxide layer 27 in the medium and low voltage transistor regions 7, 9 is masked by the oxidation resistance layer 29 the previous 11 nm thickness of the layer 27 is maintained (FIG. 1B).

After removing the oxidation resistance layer 29, a first polysilicon layer is deposited on the entire surface, having a thickness of 300 nm.

By photolithographic techniques, a resist (photoresist) pattern 31 is formed on the first polysilicon layer for defining a region where the first gate electrode of the high voltage transistor is to be formed.

Subsequently, a first gate electrode 17 is formed on the first gate oxide layer 11 by patterning the first polysilicon layer by dry etching techniques using the resist pattern 31 as a mask (FIG. 1C).

After removing the resist pattern 31, another resist pattern 33 is formed to have an opening for exposing the low voltage transistor region 9, and to mask the high and medium voltage transistor regions 5, 7.

By either dry etching or wet etching techniques, the portion of the buffer oxide layer 27 overlying the low voltage transistor region 9 is removed using the resist pattern 33 as a mask (FIG. 1D).

After removing the resist pattern 33, the structure is subjected to a thermal oxidation process under oxygen atmosphere at 850° C. for 30 minutes (second thermal oxidation process) so that a third gate oxide layer 15 is formed overlying the low transistor region 9, having a thickness of 11 nm.

In addition, the portion of the buffer oxide layer 27 overlying the medium voltage transistor region 7 increases in thickness through an additional oxidation during the second thermal oxidation process so that a second gate oxide layer 13 is formed overlying the transistor region 7, having a thickness of 16 nm.

During the second thermal oxidation process, a silicon oxide layer 19 is disposed on the surface of first gate electrode 17. In addition, since the first gate oxide layer 11 is covered by the first gate electrode 17, no increase in layer thickness occurs, and the previous 20 nm thickness is maintained (FIG. 1E).

Next, a second polysilicon layer is deposited on the surface of the semiconductor, having a thickness of 300 nm.

By photolithographic techniques, a resist pattern 35 is formed on the second polysilicon layer to define the regions where the second gate electrode of medium voltage transistor and the third gate electrode of low voltage transistor are to be formed.

Subsequently, second and third gate electrodes 21, 23 are formed on the second and third gate oxide layers 13, 15, respectively, by patterning the second polysilicon layer by dry etching techniques using the resist pattern 35 as a mask (FIG. 1F).

After removing the resist pattern 35, N-type impurity diffusion layers 25 for subsequently providing sources and drains are formed by implanting N-type impurities into transistor regions 5, 7, 9 by ion implant techniques using the gate electrodes 17, 21, 23 as masks, respectively.

Through these fabrication steps, the high voltage transistor in the high voltage transistor region 5 with the gate oxide layer having a thickness of 20 nm, the medium voltage transistor in the medium voltage transistor region 7 with the gate oxide layer having a thickness of 16 nm, and the low voltage transistor in the low voltage transistor region 9 with the gate oxide layer having a thickness of 11 nm (FIG. 1G), are formed.

The fabrication steps of the invention described above can offer several advantages over previous methods.

For example, the first and third gate oxide layers 11, 15 are each formed without any contact with resist materials, and the second gate oxide layers 13 is formed with contacting the buffer oxide layer 27 once with the resist pattern 33. As a result, contamination from photoresist impurities can be prevented during the formation of the first and third gate oxide layers 11, 15, while the contamination can be reduced to minimal for the second gate oxide layers 13.

In addition, the step of removing the buffer oxide layer 27 is carried out only for the low voltage transistor region 9, but not for the high and medium voltage transistor regions 5, 7. The formation of undesirable dip portions can therefore be avoided on the LOCOS layer 3 adjacent to the high and medium voltage transistor regions 5, 7.

As a result, three kinds of MOS transistors, which are each provided with gate oxide layers 11, 13, 15 different in thickness from each other, can be formed without detracting any transistor characteristics on the same semiconductor substrate 1.

Further, two kinds of polysilicon are used, that is, one for forming the second and third gate electrodes 21, 23, and the other for the first gate electrode 17. The MOS transistors of three kinds can thus be formed with relative ease with a reduced number of fabrication steps.

Figure 2A:
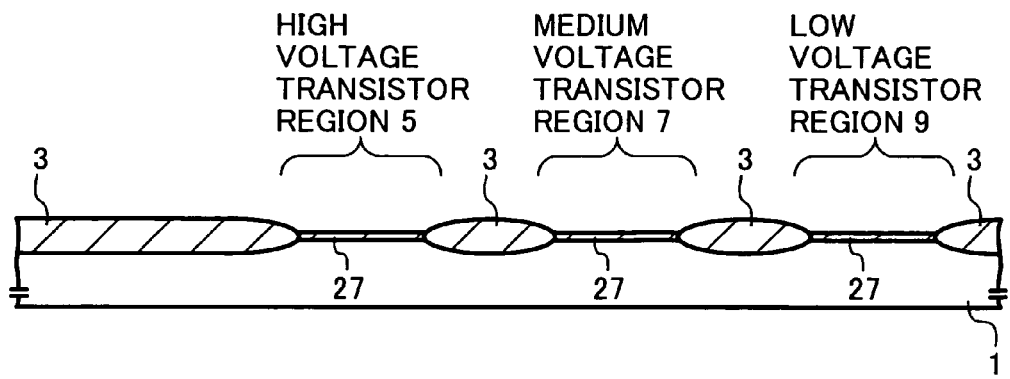
FIGS. 2A through 2H illustrate exemplary cross-sectional views of a semiconductor device during various fabrication steps according to another embodiment disclosed herein.
Figure 2B:
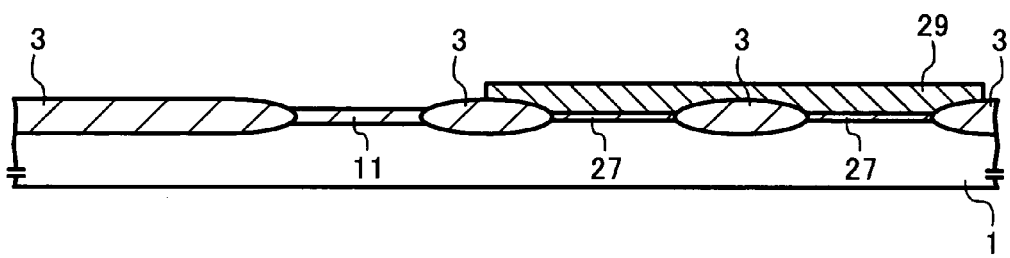
Figure 2C:
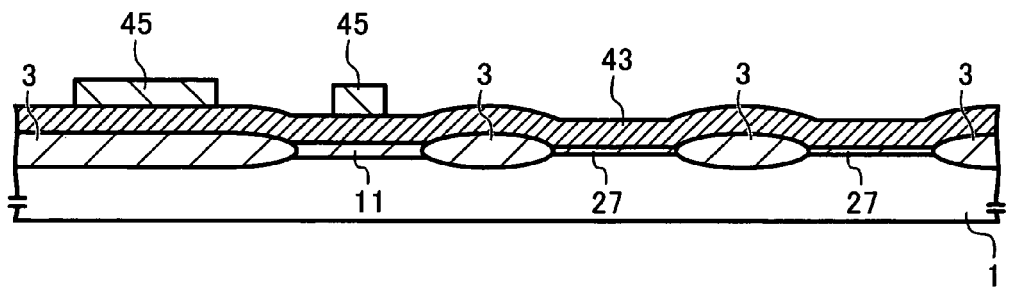
Figure 2D:
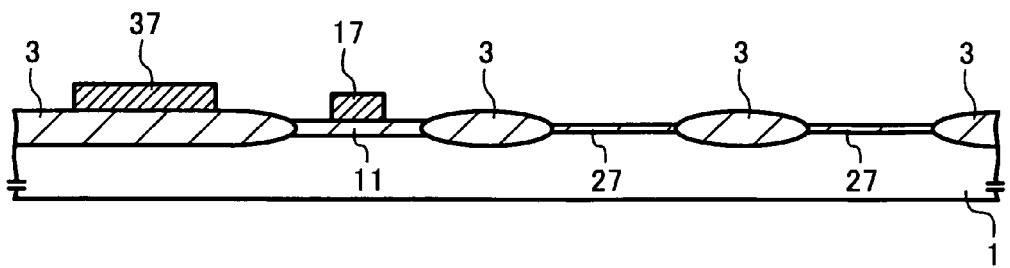
Figure 2E:
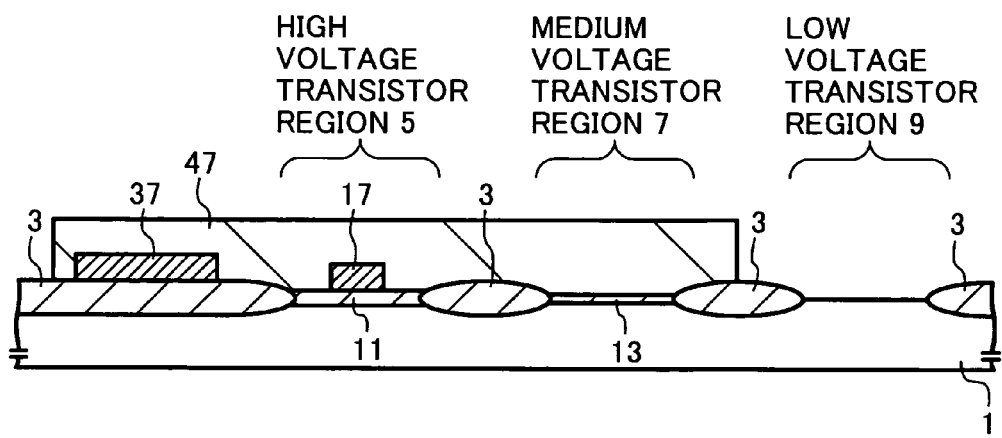
Figure 2F:
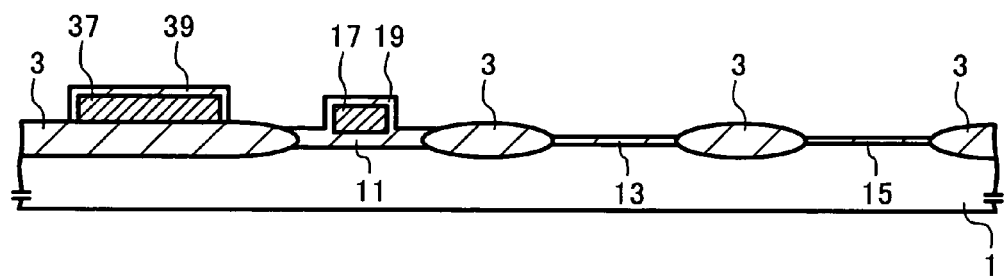
Figure 2G:
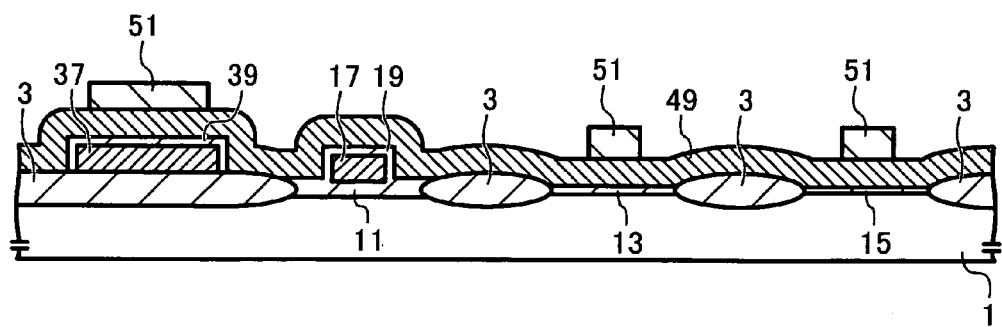
Figure 2H:
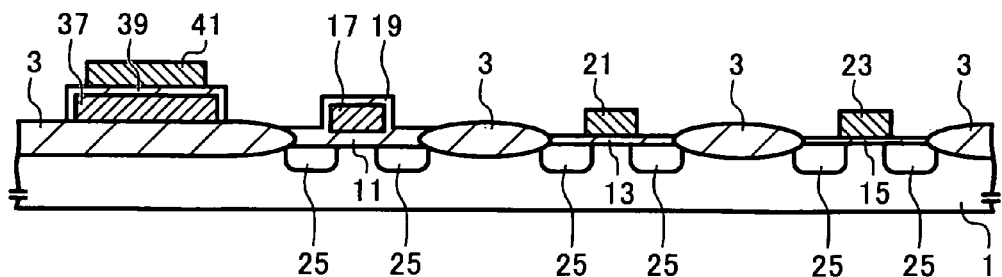

FIGS. 2A through 2H are cross-sectional views of a semiconductor device during various fabrication steps according to another embodiment of the invention disclosed herein, in which components similar to those in FIGS. 1A through 1G are shown with identical representations. FIG. 2H illustrates a cross section of the semiconductor device according to the present embodiment.

Referring now to FIGS. 2A through 2H, the structure the semiconductor device is now described.

A LOCOS layer 3 for device isolation is formed on the surface of a semiconductor substrate 1.

Field insulating regions 3 formed of the LOCOS layer serve to define a high voltage transistor region 5, a medium voltage transistor region 7, and a low voltage transistor region 9.

A high voltage transistor is formed in the high voltage transistor region 5, comprising a first gate oxide layer 11, a first gate electrode 17, and impurity diffusion layers 25, 25.

A medium voltage transistor is formed in the medium voltage transistor region 7, comprising a second gate oxide layer 13, a second gate electrode 21, and impurity diffusion layers 25, 25.

A low voltage transistor is formed in the low voltage transistor region 9, comprising a third gate oxide layer 15, a third gate electrode 13, and impurity diffusion layers 25, 25.

A first capacitor electrode 37, is formed of polysilicon on the LOCOS layer 3. On the first capacitor electrode 37, a capacitor dielectric layer 39 of silicon oxide is deposited, having a thickness of 20 nm. In addition, a second capacitor electrode 41 of polysilicon is formed over the the capacitor dielectric layer 39.

The capacitor component is thus formed on the LOCOS layer 3, comprising the first capacitor electrode 37, capacitor dielectric layer 39, and second capacitor electrode 41.

The first capacitor electrode 37 is formed simultaneously with the first gate electrode 17. While the capacitor dielectric layer 39 is deposited simultaneously with the second and third gate oxide layers 13, 15 during the thermal oxidation process.

The second capacitor electrode 41 is formed of the same polysilicon as, and simultaneously with the second and third gate electrodes 21, 23. In addition, the polysilicon for forming the second capacitor electrode 41 is different from that for forming the first gate electrode 17 and the first capacitor electrode 37.

Comprising the first capacitor electrode 37, capacitor dielectric layer 39, and second capacitor electrode 41, the capacitor component has a structure such that the capacitor dielectric layer 39 is sandwiched between first and second capacitor electrodes, 37, 41 of polysilicon.

Hence, it is generally called "double-layered poly-capacitance", which serves as an important component in analog circuits for used in, for example, filtering circuits.

In the present embodiment, a high voltage transistor for withstanding a voltage as high as 10 volts or larger, a medium voltage transistor for withstanding a voltage of approximately 5 volts, a low voltage, high speed transistor for withstanding voltage of approximately 3 volts, and a filtering circuit comprising the double-layered poly-capacitance are formed on a single chip. And, such a device may suitably be incorporated into advanced, multifunctional devices such as cellular phones, for example.

In reference to FIGS. 2A through 2H, the steps for forming the above-mentioned semiconductor device will be described according to another embodiment of the invention.

In a manner similar to the steps described earlier with reference to FIG. 1A, a LOCOS layer 3 for device isolation is grown on the surface of a semiconductor substrate 1 for defining the regions 5, 7, 9 where the high, medium and low voltage transistors are to be formed, respectively. In addition, a buffer oxide layer 27 is subsequently formed, overlying the transistor regions 5, 7, 9 over the semiconductor substrate 1, having a thickness of approximately 11 nm (FIG. 2A).

In a manner similar to the steps described earlier with reference to FIG. 1B, an oxidation resistance layer 29 is formed to mask the medium voltage transistor region 7 and the low voltage transistor region 9, while allowing the high voltage transistor region 5 to be exposed.

In addition, by subjecting the structure to a thermal oxidation process at 850° C. for 20 minutes (first thermal oxidation process), the portion of the buffer oxide layer 27 overlying the high voltage transistor region 5 increases in thickness so that a first gate oxide layer 11 is formed overlying the transistor region 5, having a thickness of 20 nm. While the portions of the buffer oxide layer 27 overlying the medium and low voltage transistor regions 7, 9 maintain the previous 11 nm thickness (FIG. 2B).

After removing the oxidation resistance layer 29, a first polysilicon layer 43 is deposited on the entire surface o, having a thickness of 300 nm.

By photolithographic techniques, a resist pattern 45 is formed on the first polysilicon layer 43 for defining the regions where the first gate electrode of the high voltage transistor and a first capacitor electrode of the capacitor component are, respectively, to be formed (FIG. 2C).

By patterning the first polysilicon layer 43 using the resist pattern 45 as a mask, the first gate electrode 17 is formed on the first gate oxide layer 11, and the first capacitor electrode 37 of the capacitor component is formed on the LOCOS layer 3. Thereafter, the resist pattern 45 is removed (FIG. 2D).

A further resist pattern 47 is formed to have an opening for exposing the low voltage transistor region 9, and to mask the high voltage transistor region 5, medium voltage transistor region 7, and first capacitor electrode 37.

By either dry etching or wet etching techniques, the portion of the buffer oxide layer 27 overlying the low voltage transistor region 9 is removed using the resist pattern 47 as a mask (FIG. 2E).

The resist pattern 47 is removed. Thereafter, in a manner similar to the steps described earlier with reference to FIG. 1E, the structure is subjected to a thermal oxidation process at 850° C. for 30 minutes (second thermal oxidation process) so that a third gate oxide layer 15 is formed overlying the low transistor region 9, having a thickness of 11 nm.

In addition, the portion of the buffer oxide layer 27 overlying the medium voltage transistor region 7 increases in thickness so that the second gate oxide layer 13 is formed, having a thickness of 16 nm, and a silicon oxide layer 19 is deposited on the surface of the first gate electrode 17.

Further, the surface of the first capacitor electrode 37 is oxidized during the oxidation process so that the capacitor dielectric layer 39 is formed, having a thickness of 20 nm.

Incidentally, since the first gate oxide layer 11 is covered by the first gate electrode 17, no increase in layer thickness takes place during the oxidation process and the previous 20 nm thickness is maintained (FIG. 2F).

A second polysilicon layer 49 is deposited on the entire surface, having a thickness of 300 nm.

By photolithographic techniques, a resist pattern 51 is formed on the second polysilicon layer 49 to define the regions where the second gate electrode of medium voltage transistor, third gate electrode of low voltage transistor, and second capacitor electrode 41 of the capacitor component are to be formed (FIG. 2G).

Thereafter, by patterning the second polysilicon layer 49 by dry etching techniques using the resist pattern 51 as a mask, the second and third gate electrodes 21, 23 are formed on the second and third gate oxide layers 13, 15, respectively, and the second capacitor electrode 41 of the capacitor component is formed on the capacitor dielectric layer 39.

After removing the resist pattern 51, N-type impurity diffusion layers 25, for subsequently providing sources and drains, are formed by implanting N-type impurities into the transistor regions 5, 7, 9 by ion implant techniques using the gate electrodes 17, 21, 23 as masks, respectively.

Through these fabrication steps, the high voltage transistor in the high voltage transistor region 5 with the gate oxide layer having a thickness of 20 nm, the medium voltage transistor in the medium voltage transistor region 7 with the gate oxide layer having a thickness of 16 nm, and the low voltage transistor in the low voltage transistor region 9 with the gate oxide layer having a thickness of 11 nm are formed. In addition, the capacitor component is formed on the LOCOS layer 3, comprising the first capacitor electrode 37, capacitor dielectric layer 39, and second capacitor electrode 41 (FIG. 2H).

The fabrication steps of the invention described above can offer several advantages over previous methods as described earlier with reference to FIGS. 1A through 1G.

For example, the first and third gate oxide layers 11, 15 are each formed without any contact with photoresist materials, however, during formation of the second gate oxide layer 13, the buffer oxide layer 27 comes into contact with the resist pattern 33. In addition, the step of removing the buffer oxide layer 27 is carried out only for the low voltage transistor region 9, but not for the high and medium voltage transistor regions 5, 7.

As a result, contamination from photoresist impurities may be maintained at a minimal level so that three kinds of MOS transistors, which are each provided with gate oxide layers 11, 13, 15 of differing thicknesses are formed on the same semiconductor substrate 1 without detracting from any other transistor characteristics.

Since two kinds of polysilicon are used, one for forming the second and third gate electrodes 21, 23, and the other for the first gate electrode 17, the MOS transistors of three kinds can be formed with relative ease and a reduced number of fabrication steps.

Furthermore, the first gate electrode 17 and the first capacitor electrode 37 of the capacitor component are formed simultaneously by patterning the first polysilicon layer 43 during the above-mentioned fabrication steps with reference to FIG. 2D; the second gate oxide layer 13, the third gate oxide layer 15, and the capacitor dielectric layer 39 are formed simultaneously during second thermal oxidation process steps with reference to FIG. 2F; and the second and third gate electrodes 21, 23, and the second capacitor electrode 41 are formed simultaneously by patterning the second polysilicon layer 49 during the above-mentioned fabrication steps with reference to FIG. 2H.

As a result, the capacitor component, comprising the first capacitor electrode 37, capacitor dielectric layer 39, and second capacitor electrode 41, can be formed on the LOCOS layer 3 with relative ease and without increasing the number of fabrication steps.

Figure 3A:
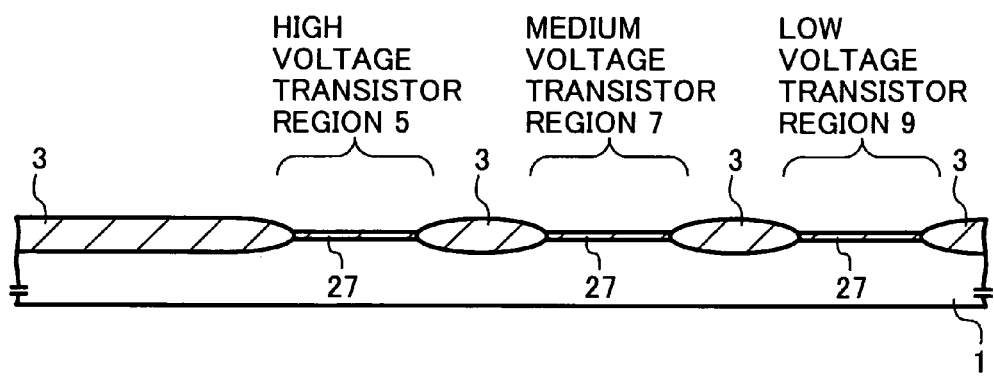

FIGS. 3A through 3H illustrate cross-sectional views of a semiconductor device during various fabrication steps according to still another embodiment disclosed herein, in which components similar to those in FIGS. 1A through 1G and 2A through 2H are shown with like reference numerals. FIG. 3H illustrates a cross section of the present embodiment of the semiconductor device.

Referring now to FIG. FIG. 3H, the structure the semiconductor device is now described.

The semiconductor device according to the present embodiment has a similar structure to that illustrated in FIG. 2H with the exception that a silicon oxide layer 59 is formed in place of the silicon oxide layer 19, and that a capacitor dielectric layer 61 of silicon oxide is formed on the surface of the first capacitor electrode 37 in place of the capacitor dielectric layer 39.

The silicon oxide layer 59 is formed to have a thickness on the first gate electrode 17 larger than the silicon oxide layer 19. In addition, the capacitor dielectric layer 61 is formed to have a thickness on the first capacitor electrode 37 larger than the capacitor dielectric layer 39 of FIG. 2H.

In reference to FIGS. 3A through 3H, the steps for forming the above-mentioned semiconductor device are now described.

In a manner similar to the steps described earlier with reference to FIG. 1A, a LOCOS layer 3 for device isolation is grown on the surface of a semiconductor substrate 1 to define the regions 5, 7, 9 where the high, medium and low voltage transistors are to be formed, respectively. In addition, a buffer oxide layer 27 is subsequently formed, overlying the transistor regions 5, 7, 9 on the semiconductor substrate 1, having a thickness of approximately 11 nm (FIG. 3A).

In a manner similar to the steps described earlier with reference to FIG. 1B, an oxidation resistance layer 29 is formed to mask the medium voltage transistor region 7 and the low voltage transistor region 9, and to have an opening for exposing the high voltage transistor region 5.

Figure 3B:
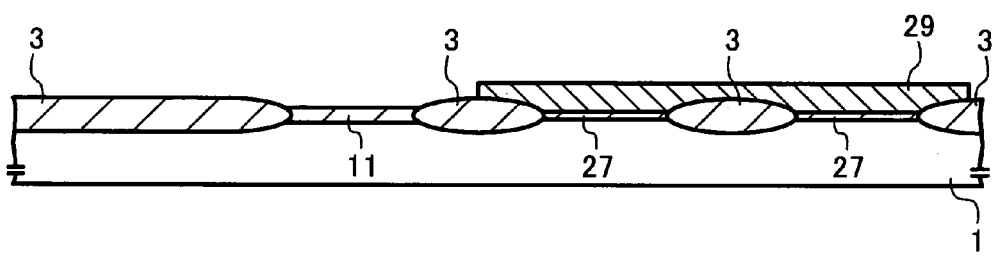

In addition, by subjecting the structure to a thermal oxidation process at 850° C. for 20 minutes (first thermal oxidation process), the portion of the buffer oxide layer 27 overlying the high voltage transistor region 5 increases in thickness so that a first gate oxide layer 11 is formed, overlying the transistor region 5, having a thickness of 20 nm. While the portions of the buffer oxide layer 27 overlying the medium and low voltage transistor regions 7, 9, maintain the previous 11 nm thickness (FIG. 3B).

After removing the oxidation resistance layer 29, a first polysilicon layer 43 is deposited on the entire surface, having a thickness of 300 nm, and a silicon oxide layer 53 is formed further thereon, having a thickness of 15 nm. The formation of the silicon oxide layer 53 may be performed either by thermal oxidation or CVD (chemical vapor deposition).

Figure 3C:
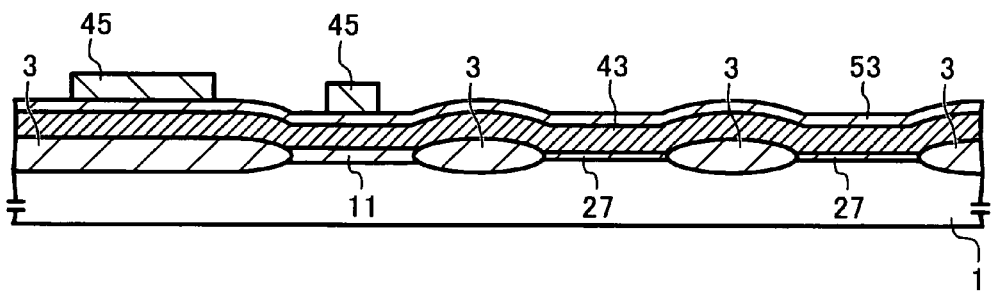

By photolithographic techniques, a resist pattern 45 is formed on the silicon oxide layer 53 gto define the regions where the first gate electrode of the high voltage transistor and a first capacitor electrode of the capacitor component are to be formed, respectively (FIG. 3C).

Figure 3D:
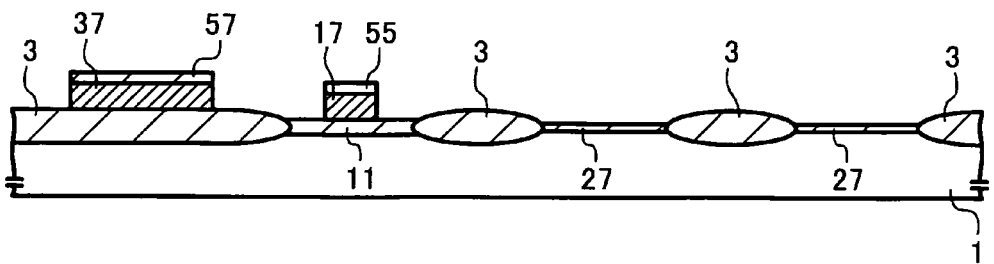
Figure 4A:
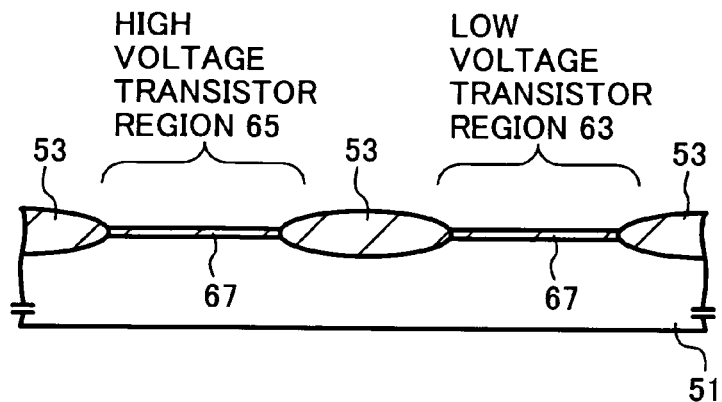
FIGS. 4A through 4D are cross-sectional views of a known semiconductor device during various fabrication steps.
Figure 4B:
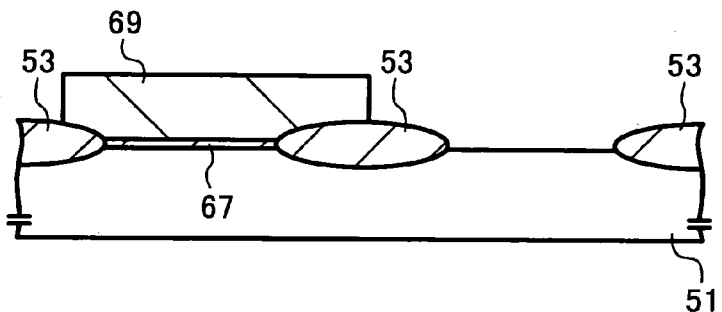
Figure 4C:
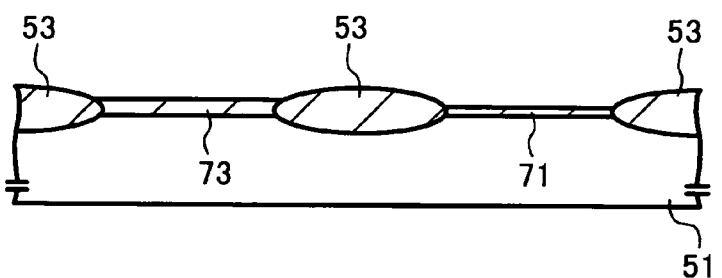
Figure 4D:
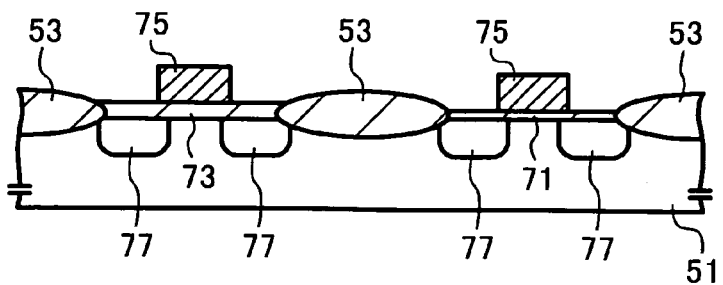
Figure 5:
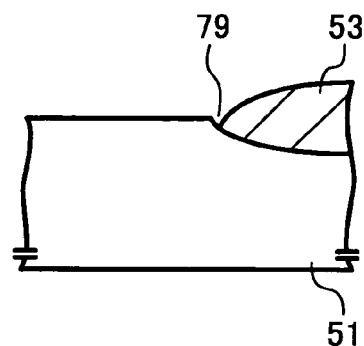
FIG. 5 illustrates a diagrammatic cross-sectional view illustrating a dip caused by etching in the vicinity of a LOCOS layer for device isolation on a semiconductor substrate.
Figure 6:
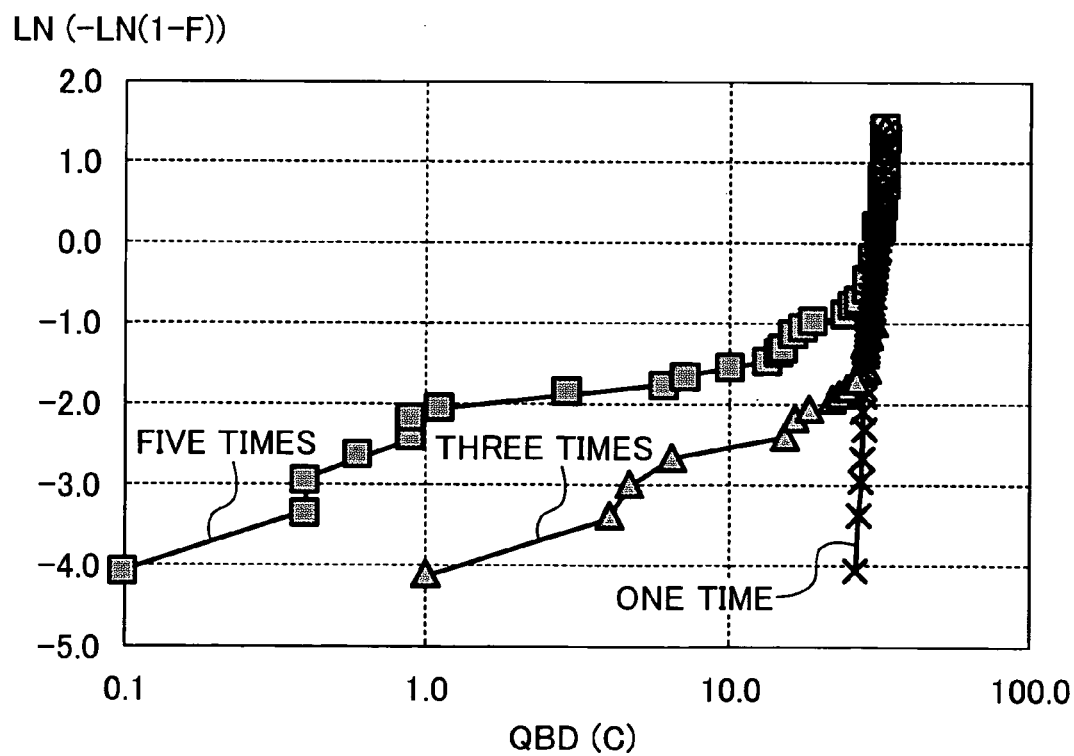
FIG. 6 includes graphical plots of Weibull distribution with cumulative defective fraction versus charge-to-breakdown.
Figure 7A:
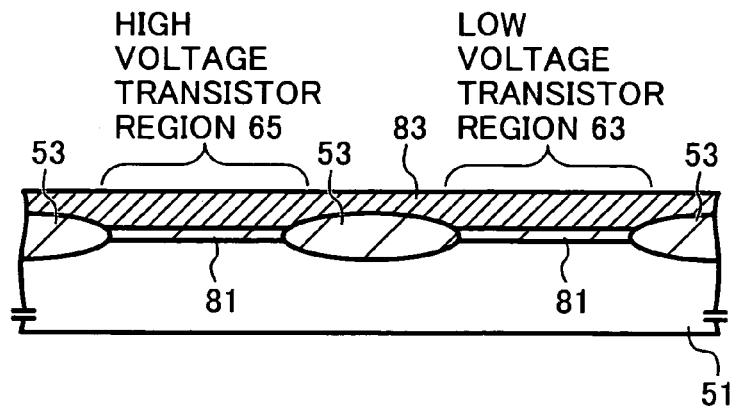
FIGS. 7A through 7D illustrate cross-sectional views of another known semiconductor device during various fabrication steps.
Figure 7B:
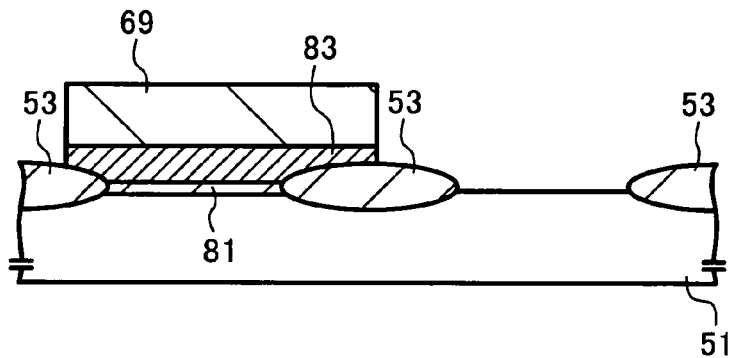
Figure 7C:
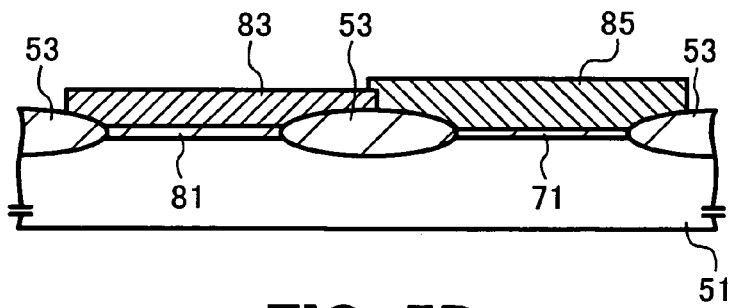
Figure 7D:
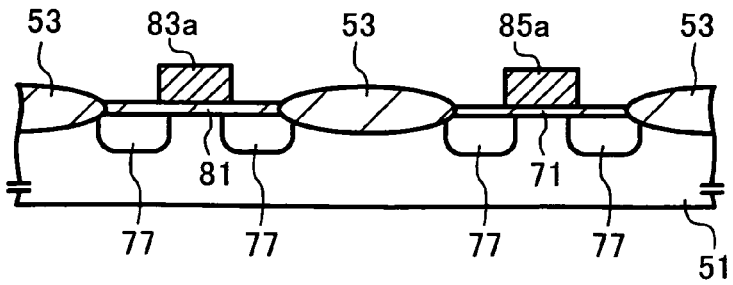
Figure 8A:
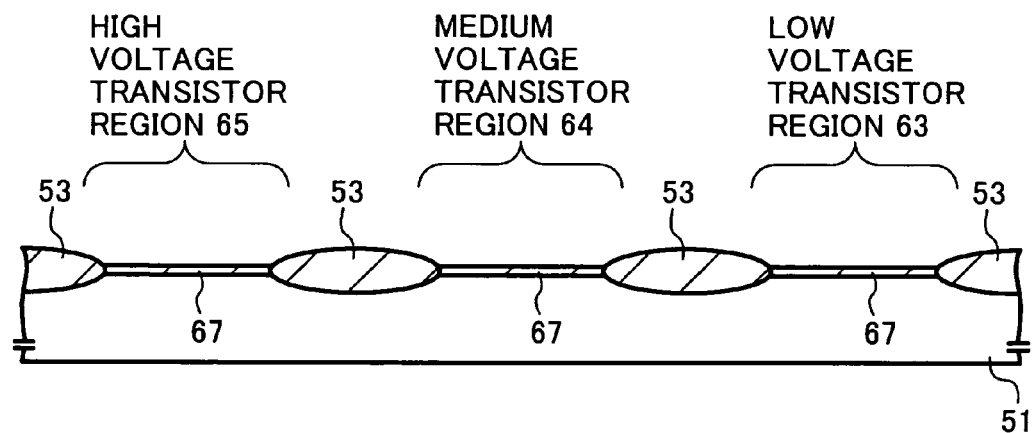
FIGS. 8A through 8F illustrate cross-sectional views of a semiconductor device during various fabrication steps when a known method is applied to the formation of three transistors with gate oxides different in thickness from each other.
Figure 8B:
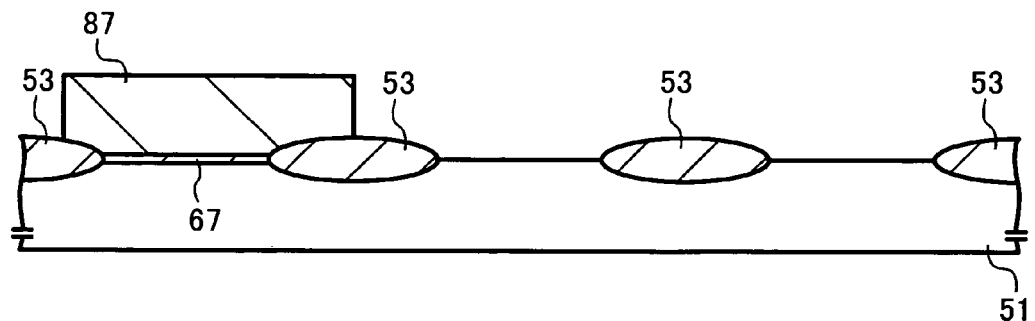
Figure 8C:
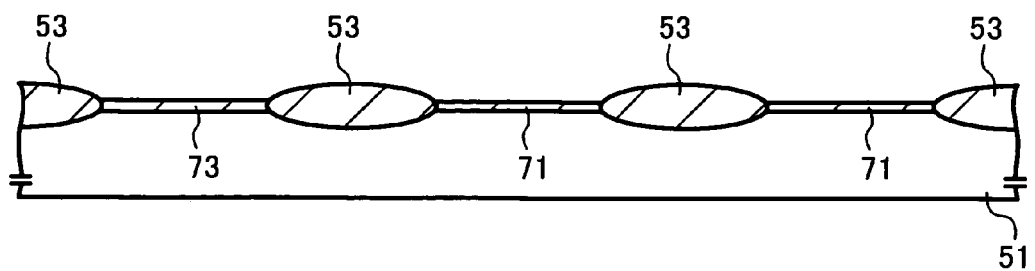
Figure 8D:
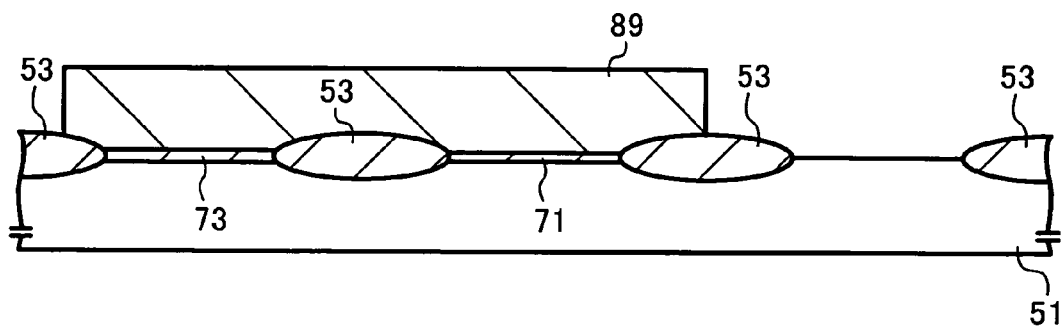
Figure 8E:
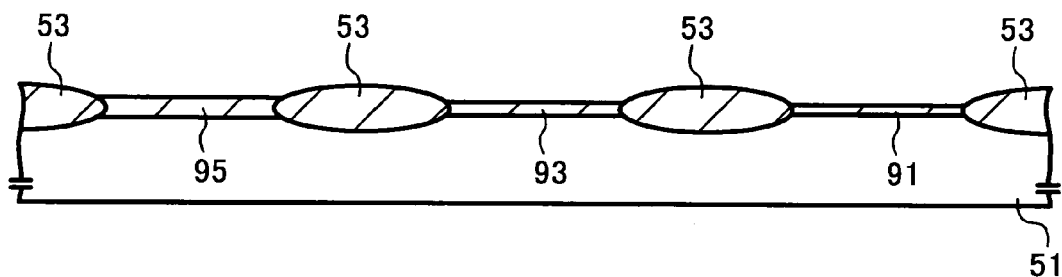
Figure 8F:
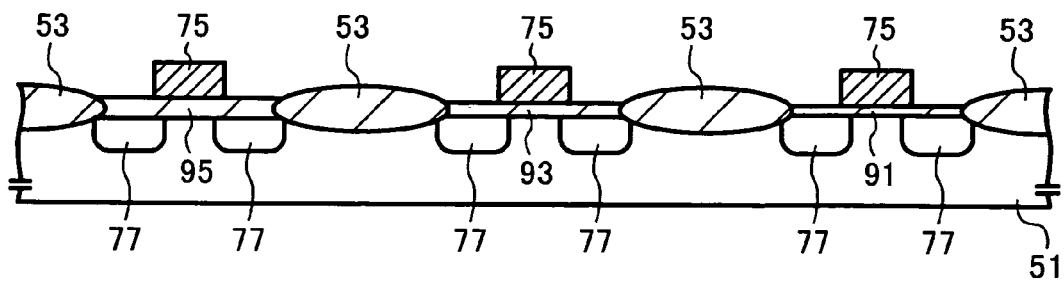
Figure 9:
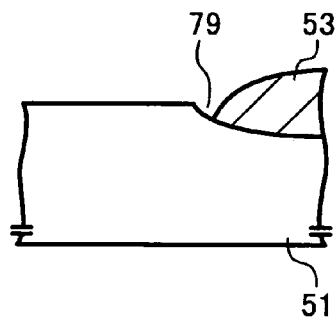
FIG. 9 illustrates a diagrammatic cross-sectional view further illustrating a dip caused by etching in the vicinity of a LOCOS layer for device isolation on a semiconductor substrate.
Figure 10A:
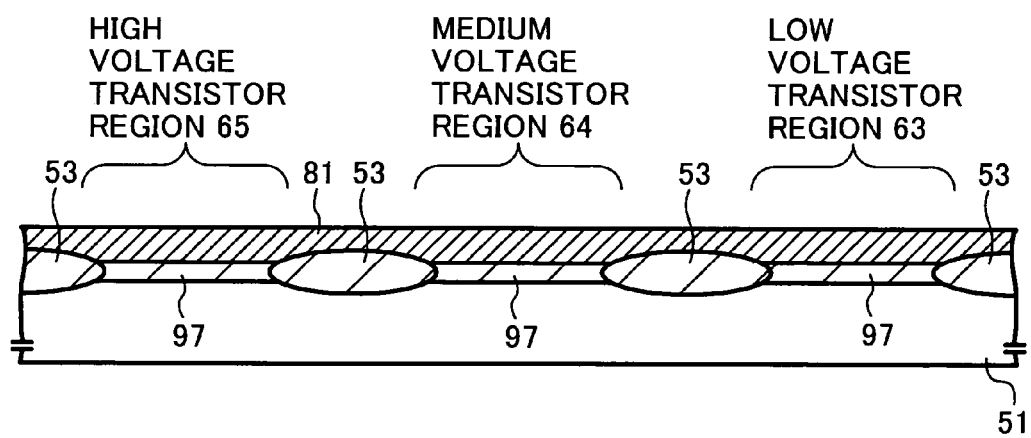
FIGS. 10A through 10E are cross-sectional views of a semiconductor device during various fabrication steps when another known method is applied to the formation of three transistors with gate oxides different in thickness from each other.
Figure 10B:
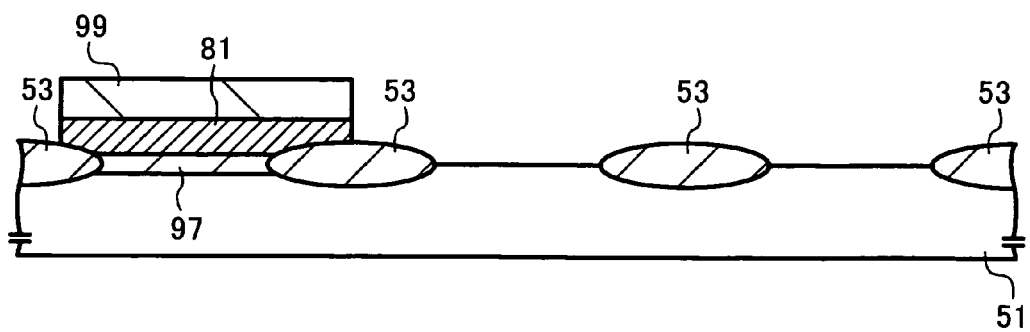
Figure 10C:
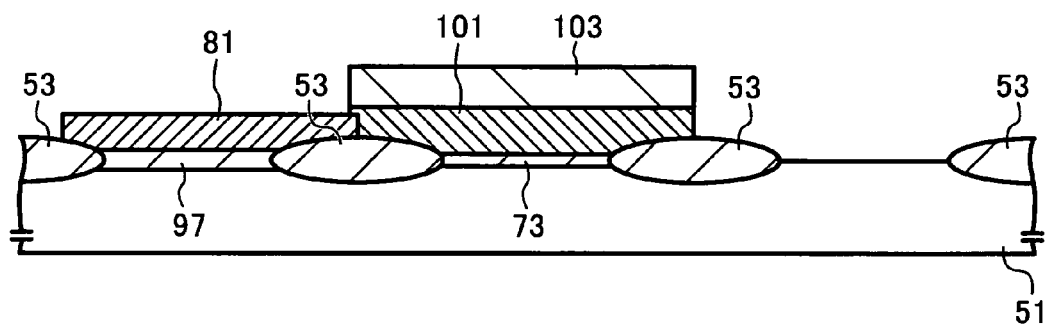
Figure 10D:
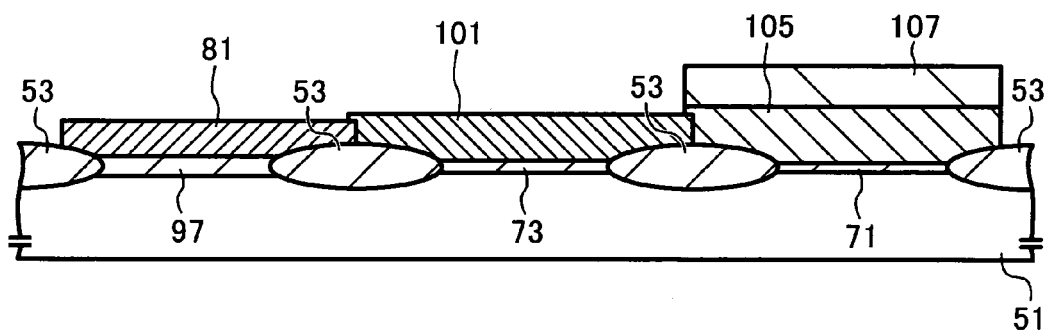
Figure 10E:
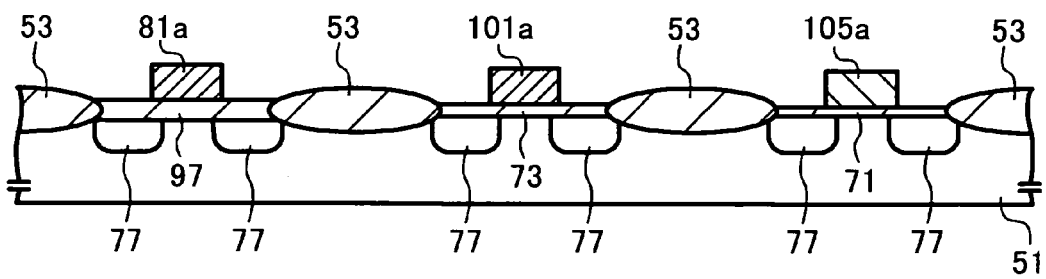

By patterning the silicon oxide layer 53 and the first polysilicon layer, 43 using the resist pattern 45 as a mask, by dry etching techniques, an accumulated pattern, consisting of the first gate electrode 17 and a silicon oxide layer 55 formed thereon, is formed on the first gate oxide layer 1. Another accumulated pattern, consisting of the first capacitor electrode 37 and a silicon oxide layer 57 formed thereon, is formed on the LOCOS layer 3. Thereafter, the resist pattern 45 is removed (FIG. 3D).

A further resist pattern 47 is formed to have an opening for exposing the low voltage transistor region 9, and to mask the high voltage transistor region 5, medium voltage transistor region 7, first capacitor electrode 37, and silicon oxide layer 57.

By either dry etching or wet etching techniques, the portion of the buffer oxide layer 27 overlying the low voltage transistor region 9 is removed using the resist pattern 47 as a mask (FIG. 3E).

The resist pattern 47 is subsequently removed.

In a manner similar to the steps described earlier with reference to FIG. 1E, the structure is subjected to a thermal oxidation process at 850° C. for 30 minutes (second thermal oxidation process) so that a third gate oxide layer 15 is formed, overlying the low transistor region 9, having a thickness of 11 nm.

In addition, the portion of the buffer oxide layer 27 overlying the medium voltage transistor region 7 increases in thickness so that the second gate oxide layer 13 is formed, having a thickness of 16 nm.

Further, the surface of the first gate electrode 17 is oxidized during the oxidation process so that a silicon oxide layer 59 is formed, consisting of its upper face, having a thickness of 30 nm, and side walls, each having a thickness of 20 nm.

Still further, the surface of the first capacitor electrode 37 is oxidized also during the oxidation process so that a capacitor dielectric layer 61 is formed, consisting of its upper face, having a thickness of 30 nm, and side walls, each having a thickness of 20 nm.

Incidentally, since the first gate oxide layer 11 is covered by the first gate electrode 17, no increase in layer thickness takes place during the oxidation process for the gate oxide layer 11, and the previous 20 nm thickness is maintained (FIG. 3F).

In a manner similar to the steps described earlier with reference to FIG. 2G, a second polysilicon layer 49 is deposited on the entire surface over the semiconductor substrate 1, having a thickness of 300 nm.

By photolithographic techniques, a resist pattern 51 is formed on the second polysilicon layer 49 to define the regions where the second gate electrode of medium voltage transistor, third gate electrode of low voltage transistor, and second capacitor electrode of the capacitor component are to be formed (FIG. 3G).

Thereafter, by patterning the second polysilicon layer by dry etching techniques using the resist pattern 51 as a mask, second and third gate electrodes 21, 23 are formed on the second and third gate oxide layers 13, 15, respectively, and the second capacitor electrode 41 of the capacitor component is formed on the capacitor dielectric layer 61.

After removing the resist pattern 51, N-type impurity diffusion layers 25, for subsequently providing sources and drains, are formed by implanting N-type impurities into the transistor regions 5, 7, 9 by ion implant techniques using the gate electrodes 17, 21, 23 as masks, respectively.

Through these fabrication steps, the high voltage transistor in the high voltage transistor region 5 with the gate oxide layer having a thickness of 20 nm, the medium voltage transistor in the medium voltage transistor region 7 with the gate oxide layer having a thickness of 16 nm, and the low voltage transistor in the low voltage transistor region 9 with the gate oxide layer having a thickness of 11 nm are formed. In addition, the capacitor component is formed on the LOCOS layer 3, comprising the first capacitor electrode 37, capacitor dielectric layer 61, and second capacitor electrode 41 (FIG. 3H).

The fabrication steps of the invention described above can offer several advantages over previous methods in a similar manner described earlier referring to FIGS. 1A through 1G.

For example, the first and third gate oxide layers 11, 15 are each formed without any contact with the photoresist materials, however, during the formation of the second gate oxide layers 13, the buffer oxide layer 27 comes into contact with the resist pattern 33. In addition, the step of removing the buffer oxide layer 27 is carried out only for the low voltage transistor region 9, and not for the high and medium voltage transistor regions 5, 7.

As a result, contamination from photoresist impurities maintained at a minimal level so that three kinds of MOS transistors, which are each provided with gate oxide layers 11, 13, 15 of differing thicknesses, are formed on the same semiconductor substrate 1 without detracting from any of the transistor characteristics.

In addition, since two kinds of polysilicon are used, one for forming the second and third gate electrodes 21 and 23, and the other for the first gate electrode 17, the MOS transistors of three kinds can thus be formed with relative ease and a reduced number of fabrication steps.

Furthermore, the silicon oxide layer 53 for use in forming the capacitor dielectric layer of the capacitor component is formed on the first polysilicon layer 43 during the steps described earlier with reference to FIG. 3C; the accumulated pattern of the first gate electrode 17 and silicon oxide layer 55, and another accumulated pattern of the first capacitor electrode 37 and silicon oxide layer 57 are formed of the silicon oxide layer 53 and first polysilicon layer 43 during the steps described earlier with reference to FIG. 3D; the capacitor dielectric layer 61 is formed by increasing the thickness of the silicon oxide layer 57 on the first capacitor electrode 37 during the steps for forming the second and third gate oxide layers 13, 15 described earlier with reference to FIG. 3F; and the second capacitor electrode 41 is formed simultaneously with the second and third gate electrodes 21, 23 during the steps described earlier with reference to FIG. 3H.

As a result, the capacitor component, comprising the first capacitor electrode 37, capacitor dielectric layer 61, and second capacitor electrode 41, can be formed on the LOCOS layer 3 with relative ease and without having to include many additional fabrication steps (i.e., only adding one step for forming the silicon oxide layer 53).

In addition, by suitably taking the effects of the layer thickness increase into consideration regarding the second thermal oxidation process steps described earlier with reference to FIG. 3F, the formation of the capacitor dielectric layer 61 becomes feasible, which yields an arbitrary, desirable thickness of the capacitor dielectric layer 61.

While the capacitor dielectric layer 61 is formed by disposing the silicon oxide layer 53 on the first polysilicon layer 43 (FIG. 3C) and subsequently increasing the thickness of the oxide layer 53 (silicon oxide layer 57), it is not intended to be limited to the processes described herein.

For example, by disposing a layer of either silicon nitride or ONO on the first polysilicon layer 43 in place of the silicon oxide layer 53 (FIG. 3C), and by performing succeeding steps described earlier with reference to FIGS. 3C through 3H, a capacitor component can be formed on the LOCOS layer 3, which is provided with a capacitor dielectric layer of silicon nitride or ONO (oxide-nitride-oxynitride).

In addition, although the embodiments have been described with reference to the structure in which the first gate oxide layer 11 is formed, having a large thickness, overlying the first region (transistor region 5); the second gate oxide layer 13 is formed, having a medium thickness, overlying the second region (transistor region 7); and the third gate oxide layer 15 is formed, having a small thickness, overlying the third region (transistor region 9), these gate oxide layers may alternatively be formed as follows.

By selectively adjusting process parameters during the second thermal oxidation process (FIG. 1E, 2F, or 3F) such that the third gate oxide layer 15 is formed to have a thickness larger than the first gate oxide layer 11, the gate oxide layers can be formed, increasing the layer thickness in turn from the second gate oxide layer 13, the third gate oxide layer 15, and the first gate oxide layer 11.

Still in addition, by adjusting process parameters during the second thermal oxidation process such that the third gate oxide layer 15 is formed to have a thickness smaller than the first gate oxide layer 11, the gate oxide layers can alternatively be formed, increasing the layer thickness in turn from the second gate oxide layer 13, the first gate oxide layer 11, and the third gate oxide layer 15.

Incidentally, the thickness of the first, second, and third gate oxide layers 11, 13, and 15 can be determined arbitrarily by suitably adjusting first thermal oxidation conditions for forming the buffer oxide layer 27 and gate oxide layers 11, and second thermal oxidation conditions for the second gate oxide layer 13 and third gate oxide layer 15.

It is apparent from the above description, including the examples, the methods and semiconductor devices disclosed herein have several advantages over similar methods and devices previously known.

For example, since the first and third gate oxide layers are formed during thermal oxidation processes by increasing the layer thickness of the buffer oxide layers overlaying the first and third regions, respectively, none of the resist patterns are brought into contact with the gate oxide layers.

In addition, after using a resist pattern to create an opening for masking the second region, the second gate oxide layer is formed during second thermal oxidation process by increasing the layer thickness of the buffer oxide layer overlaying the second region. As a result, the second gate oxide layer comes into contact once with a resist pattern.

As a result, contamination from photoresist impurities can be prevented during the formation of the first and third gate oxide layers, while the contamination can be maintained at a minimal level for the second gate oxide layers.

The removal of the buffer oxide layer is carried out only for the third region, and not for the first and second regions. The formation of undesirable dip portions caused by etching can therefore be avoided on the dielectric layer for the device isolation adjacent to the first and second regions.

As a result, three kinds of MOS transistors, which are each provided with gate oxide layers of differing thicknesses are formed without detracting from any of the transistor characteristics.

Since only two kinds of polysilicon are used, the MOS transistors of three different kinds can be formed with relative ease and with a reduced number of fabrication steps.

As another example, the first capacitor electrode is formed of the first polysilicon layer on the dielectric layer for device isolation, the capacitor dielectric layer is formed on the first capacitor electrode simultaneously with the second and third gate oxide layers, and the second capacitor electrode is formed of the second polysilicon layer on the capacitor dielectric layer.

As a result, the capacitor component, comprising the first capacitor electrode, capacitor dielectric layer, and second capacitor electrode, can be formed on the dielectric layer for device isolation with relative ease and without increasing the number of fabrication steps.

As a further example, the silicon oxide layer for the capacitor dielectric layer of the capacitor component is formed on the first polysilicon layer, the first accumulated pattern of the first gate electrode and silicon oxide layer, and the second accumulated pattern of the first capacitor electrode and silicon oxide layer are formed of the silicon oxide layer and first polysilicon layer, and a capacitor dielectric layer is formed by increasing the thickness of the silicon oxide layer on the first capacitor electrode; and a second capacitor electrode is formed simultaneously with the second and third gate electrodes.

Therefore, another capacitor component, comprising the first capacitor electrode, capacitor dielectric layer, and second capacitor electrode, can be formed on the dielectric layer for device isolation with relative ease and without increasing the number of fabrication steps.

In addition, by taking the effects of the layer thickness increase into consideration with regard to the second thermal oxidation process steps, the formation of the capacitor dielectric layer becomes feasible yielding an arbitrary, desirable thickness of the capacitor dielectric layer.

By means of the process steps of the invention, therefore, three MOS transistors can be placed on a single semiconductor substrate, each provided with gate oxides of differing thicknesses, without detracting from the device characteristics.

The process steps for forming semiconductor devices may be implemented using conventional general purpose microprocessors, and programmed according to the teachings in the present specification, as will be appreciated to those skilled in the relevant arts. Appropriate software coding can readily be prepared by skilled programmers based on the teachings of the present disclosure, as will also be apparent to those skilled in the relevant arts.

The present specification also includes a computer-based product which may be hosted on a storage medium, and instructions for programming a microprocessor to perform a process in accordance with the present invention. This storage medium is not limited to any disk type, and may include floppy discs, optical discs, CD-ROMs, magneto-optical discs, ROMs, RAMs, EPROMs, EEPROMs, flash memory, magnetic or optical cards, or any type of media suitable for storing electronic instructions.

Obviously, additional modifications and variations of the present invention are possible in light of the above teachings. It is therefore to be understood that within the scope of the appended claims, the invention may be practiced in other ways than those specifically described herein.

What is claimed is:

1. A method for forming three kinds of MOS transistors on a single semiconductor substrate, said three kinds of MOS transistors each being provided with gate oxides of differing thicknesses, comprising the steps of:
   (a) forming a dielectric layer for device isolation on a surface of the semiconductor substrate for defining first, second, and third regions;
   (b) depositing buffer oxide layers on a surface of said semiconductor substrate each overlying said first, second, and third regions;
   (c) forming an oxidation resistance layer to have an opening for exposing said first region and to mask said second and third regions;
   (d) performing a first thermal oxidation process for forming a first gate oxide layer by increasing a layer thickness of said oxide layer overlaying said first region;
   (e) removing said oxidation resistance layer;
   (f) depositing a first polysilicon layer over a surface of said semiconductor substrate to be patterned for forming a first gate electrode on said first gate oxide layer;
   (g) forming a resist pattern to have an opening for exposing said third region and to mask said first, and said second regions;
   (h) removing said buffer oxide layer on said third region using said resist pattern as a mask;
   (i) removing said resist pattern;
   (j) performing a second thermal oxidation process for forming a second gate oxide layer by increasing a layer thickness of said buffer oxide layer overlaying said second region, having a thickness different from said first gate oxide, and for forming a third gate oxide layer by increasing a layer thickness of said buffer oxide layer overlaying said third region, having a thickness different from said first, and said second gate oxides;
   (k) depositing a second polysilicon layer over the surface of said semiconductor substrate; and
   (l) patterning said second polysilicon layer for forming second, and third gate electrodes on said second, and third gate oxide layers, respectively.

2. The method according to claim 1, wherein said oxidation resistance layer essentially consists of silicon nitride.

3. The method according to claim 1, further comprising the steps of:
   forming a first capacitor electrode formed of said first polysilicon layer on said dielectric layer for device isolation, performed during step (f);
   forming a capacitor dielectric layer on said first capacitor electrode simultaneously with said second, and said third gate oxide layers, performed during step (i); and
   forming a second capacitor electrode formed of said second polysilicon layer on said capacitor dielectric layer, performed during step (k).

4. The method according to claim 3, wherein said oxidation resistance layer essentially consists of silicon nitride.

5. The method according to claim 1, further comprising the steps of:
   forming a capacitor dielectric layer after forming, and prior to patterning said first polysilicon layer, subsequently a first accumulated pattern of said first gate electrode and said capacitor dielectric layer on said gate oxide layer by patterning said capacitor dielectric layer and said first polysilicon layer, and a second accumulated pattern of said first capacitor electrode formed of said first polysilicon layer and said capacitor dielectric layer on said dielectric layer for device isolation, performed during step (f); and
   forming a second capacitor electrode of said second polysilicon layer on said capacitor dielectric layer during step (k).

6. The method according to claim 5, wherein said oxidation resistance layer essentially consists of silicon nitride.

* * * * *